United States Patent
Fukuoka

(10) Patent No.: US 9,712,775 B2
(45) Date of Patent: Jul. 18, 2017

(54) SEMICONDUCTOR DEVICE

(71) Applicant: OLYMPUS CORPORATION, Tokyo (JP)

(72) Inventor: Naoto Fukuoka, Atsugi (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/052,037

(22) Filed: Feb. 24, 2016

(65) Prior Publication Data

US 2016/0173803 A1 Jun. 16, 2016

Related U.S. Application Data

(63) Continuation of application No. PCT/JP2014/074652, filed on Sep. 18, 2014.

(30) Foreign Application Priority Data

Sep. 18, 2013 (JP) ................................ 2013-192904

(51) Int. Cl.
*H04N 5/378* (2011.01)
*H01L 27/146* (2006.01)

(52) U.S. Cl.
CPC ....... *H04N 5/378* (2013.01); *H01L 27/14623* (2013.01); *H01L 27/14634* (2013.01); *H01L 27/14636* (2013.01)

(58) Field of Classification Search
CPC ......... H01L 27/14623; H01L 27/14634; H01L 27/14636; H04N 5/378
See application file for complete search history.

(56) References Cited

U.S. PATENT DOCUMENTS

| | | | |
|---|---|---|---|
| 8,542,614 B2 * | 9/2013 | Lee .......................... | H04B 1/56 370/277 |
| 2004/0008270 A1 * | 1/2004 | Hisamatsu ............. | H04N 5/185 348/257 |

(Continued)

FOREIGN PATENT DOCUMENTS

| JP | 61-5549 A | 1/1986 |
|---|---|---|
| JP | 4-340732 A | 11/1992 |

(Continued)

OTHER PUBLICATIONS

International Search Report dated Dec. 22, 2014, issued in counterpart International Application No. PCT/JP2014/074652 (2 pages).

(Continued)

*Primary Examiner* — Amy Hsu
(74) *Attorney, Agent, or Firm* — Westerman, Hattori, Daniels & Adrian, LLP

(57) ABSTRACT

Provided is a semiconductor device including: a first substrate having a first circuit manufactured thereon; a second substrate having a second circuit manufactured thereon and being arranged to be spaced apart from the first substrate; connection part that is arranged between the first substrate and the second substrate and electrically connect the first circuit and the second circuit; and a shielding layer that is sandwiched, together with the connection part, between the first substrate and the second substrate, is arranged so as to surround the connection part, and is connected to an electric potential with a constant value within at least one of the first substrate and the second substrate.

12 Claims, 14 Drawing Sheets

(56) References Cited

U.S. PATENT DOCUMENTS

| | | | | |
|---|---|---|---|---|
| 2006/0163628 A1* | 7/2006 | Mori | ............... | H01L 27/14609 |
| | | | | 257/291 |
| 2007/0013799 A1* | 1/2007 | Hirota | ............... | H04N 5/335 |
| | | | | 348/311 |
| 2007/0206423 A1* | 9/2007 | Segami | ............... | H04N 3/1568 |
| | | | | 365/185.27 |
| 2011/0037863 A1* | 2/2011 | Mihota | ............... | G03B 17/00 |
| | | | | 348/208.99 |
| 2011/0309236 A1* | 12/2011 | Tian | ............... | H01L 27/14603 |
| | | | | 250/208.1 |
| 2013/0256824 A1* | 10/2013 | Mizuta | ............... | H01L 27/1464 |
| | | | | 257/459 |
| 2015/0155323 A1* | 6/2015 | Ahn | ............... | H01L 27/14616 |
| | | | | 257/184 |

FOREIGN PATENT DOCUMENTS

| | | |
|---|---|---|
| JP | 10-27989 A | 1/1998 |
| JP | 2003-347506 A | 12/2003 |
| JP | 2006-156866 A | 6/2006 |
| JP | 2007/105478 A1 | 9/2007 |
| JP | 2012-89739 A | 5/2012 |
| JP | 2013-16963 A | 1/2013 |
| JP | 2013-183347 A | 9/2013 |

OTHER PUBLICATIONS

Office Action dated Mar. 14, 2017, issued in counterpart Japanese Patent Application No. 2013-192904, with English translation. (6 pages).

\* cited by examiner

SEMICONDUCTOR DEVICE

This application is a continuation application based on a PCT International Application No. PCT/JP2014/074652, filed on Sep. 18, 2014, whose priority is claimed on Japanese Patent Application No. 2013-192904, filed on Sep. 18, 2013.

Both of the content of the PCT International Application and the Japanese Application are incorporated herein by reference.

BACKGROUND OF THE INVENTION

Field of the Invention

The present invention particularly relates to a semiconductor device with a three-dimensional structure, and to a solid state imaging device.

Description of Related Art

In recent years, as solid state imaging devices, complementary metal oxide semiconductor (CMOS) type solid state imaging devices (hereinafter referred to as "MOS type solid state imaging devices") have attracted attention and have been put into practical use. The MOS type solid state imaging devices can be driven by a single power source, unlike charge coupled device (CCD) type solid state imaging devices. Additionally, an exclusive manufacturing process is required in the CCD type solid state imaging devices, whereas the MOS type solid state imaging devices can be manufactured using the same manufacturing process as other LSIs. Therefore, dealing with a system on chip (SOC) is simple, and multiple functions of the solid state imaging devices are enabled. Additionally, the MOS type solid state imaging devices have a configuration in which these imaging devices are hardly influenced by noise from channels of communication of signals because signal charges are amplified within pixels by including an amplifying circuit in each pixel. Moreover, the MOS type solid state imaging devices have features in which it is possible for signal charges of respective pixels to be selected and taken out (selection system), and in principle, storage time and read-out order of signals can be freely controlled for each pixel.

Additionally, semiconductor devices of a stacked structure (three-dimensional structure) in which a plurality of substrates are three-dimensionally connected have attracted attention as dominant structures for maintaining improvements in the degree of integration in the semiconductor devices. In the semiconductor devices of the three-dimensional structure, for example, various barriers that semiconductor devices of a two-dimensional structure confront, such as the limitation of lithography in microfabrication, an increase in wiring resistance or an increase in a parasitic effect caused by the microfabrication of wiring or an increase in wiring length, the saturation tendency of the operating speed accompanied with these increases, and a high field effect caused by reduction of element dimensions, can be avoided by integrating semiconductor elements on a structure in which semiconductor active layers are three-dimensionally laminated in multilayer.

From this, in the related-art solid state imaging devices (hereinafter referred to as "imagers"), a monolithic structure was the mainstream design. In contrast, also in recent imagers, a three-dimensional structure has been put into practical use.

However, in the semiconductor devices of the three-dimensional structure, the influence of noise caused by wiring that connects the stacked substrates in accordance with an increase in the degree of integration cannot be avoided. Particularly, in the case of the imagers of the three-dimensional structure, a problem occurs in that an acquired image deteriorates due to the influence of the mixed in the wiring that connects the substrates. As a technique for solving such a problem, for example, a technique of providing shield wiring around penetration electrodes for connecting stacked substrates, thereby reducing the influence of noise, is suggested as disclosed in Japanese Unexamined Patent Application, First Publication No. 2012-089739.

SUMMARY OF INVENTION

A semiconductor device of a first aspect of the invention includes a first substrate having a first circuit manufactured thereon; a second substrate having a second circuit manufactured thereon and being arranged to be spaced to the first substrate; a connection part that is arranged between the first substrate and the second substrate and electrically connects the first circuit and the second circuit; and a shielding layer that is sandwiched, together with the connection part, between the first substrate and the second substrate, is arranged so as to surround the connection part, and is connected to an electric potential with a constant value within at least one of the first substrate and the second substrate. When the signals transmitted and received via the connection part between the first circuit manufactured on the first substrate and the second circuit manufactured on the second substrate are sorted into signals that operate at a low speed and signals that operate at a high speed, the shielding layer is arranged so as to surround the connection part that transmit and receive the signals that operate at the high speed and the shielding layer is not arranged so as to surround the connection part that transmit and receive the signals that operate at the low speed.

According to a second aspect of the invention based on the above first aspect, the shielding layer may include a plurality of unit shielding layers, and, as seen from a direction in which the first substrate and the second substrate are stacked, the plurality of unit shielding layers may be arranged so as to surround the connection part.

According to a third aspect of the invention based on the above second aspect, the shielding layer may include a first unit shielding layer and a second unit shielding layer, and the first unit shielding layer and the second unit shielding layer may be arranged so as to surround the corresponding connection part.

According to a fourth aspect of the invention based on the above third aspect, the shielding layer may further include a third unit shielding layer and a fourth unit shielding layer, and the third unit shielding layer and the fourth unit shielding layer may be arranged so as to surround the corresponding connection part, in a direction orthogonal to a line connecting positions where the corresponding first unit shielding layer and second unit shielding layer are arranged.

According to a fifth aspect of the invention based on any one aspect of the above second aspect to the above fourth aspect, the plurality of unit shielding layers may have the same shape as connecting surfaces for the connection part, that the connecting surfaces being respectively manufactured on the first substrate and the second substrate.

According to a sixth aspect of the invention based on the above first aspect, an electric potential is manufactured on either the first substrate or the second substrate, and the shielding layer is connected to the electric potential with a constant value within the substrate on which the shielding layer is manufactured.

According to a seventh aspect of the invention based on any one aspect of the above second aspect to the above fifth aspect, one unit shielding layer of the first unit shielding layer and the second unit shielding layer may be manufactured on the first substrate and the other unit shielding layer may be manufactured on the second substrate, and the first unit shielding layer and the second unit shielding layer may be respectively connected to electric potentials with constant values within the substrates on which the unit shielding layers are manufactured.

According to an eighth aspect of the invention based on any one aspect of the above first aspect to the above seventh aspect, the first circuit may include a plurality of pixels that convert incident light into electrical signals and transmit the converted electrical signals to the second circuit via the connection part as pixel signals, and the second circuit may include a processing circuit that receives the pixel signals transmitted from the respective pixels via the connection part and perform processing on the received pixel signals.

According to a ninth aspect of the invention based on the above eighth aspect, the shielding layer may be arranged so as to surround the connection part that transmit and receive analog signals between the first circuit manufactured on the first substrate and the second circuit manufactured on the second substrate.

According to a tenth aspect of the invention based on the above first aspect, the signals that operate at the low speed may be control signals.

According to an eleventh aspect of the invention based on any one aspect of the above eighth aspect to the above tenth aspect, the first circuit or the second circuit may further include at least an AD conversion circuit that converts the pixel signals into digital data; a serializer that serializes the multi-bit digital data after the AD conversion into 1-bit digital data; and a clock signal supply circuit that supplies clock signals that drive the serializer.

According to a twelfth aspect of the invention based on any one aspect of the above first aspect to the above eleventh aspect, the shielding layer may be manufactured of the same material as the connection part.

DETAILED DESCRIPTION OF THE INVENTION

Hereinafter, embodiments of the invention will be described with reference to the drawings. In addition, specific detailed contents are included in the following description for illustration. However, even in a case where various changes are made to the detailed contents to be described below, a person skilled in the art will be able to understand that such changes do not depart from the scope of the invention. Therefore, the illustrative embodiments of the invention to be described below are described without losing generality and putting any limitation on configuration, with respect to the invention of which the right has been claimed.

<Semiconductor Device>

Figure 1:
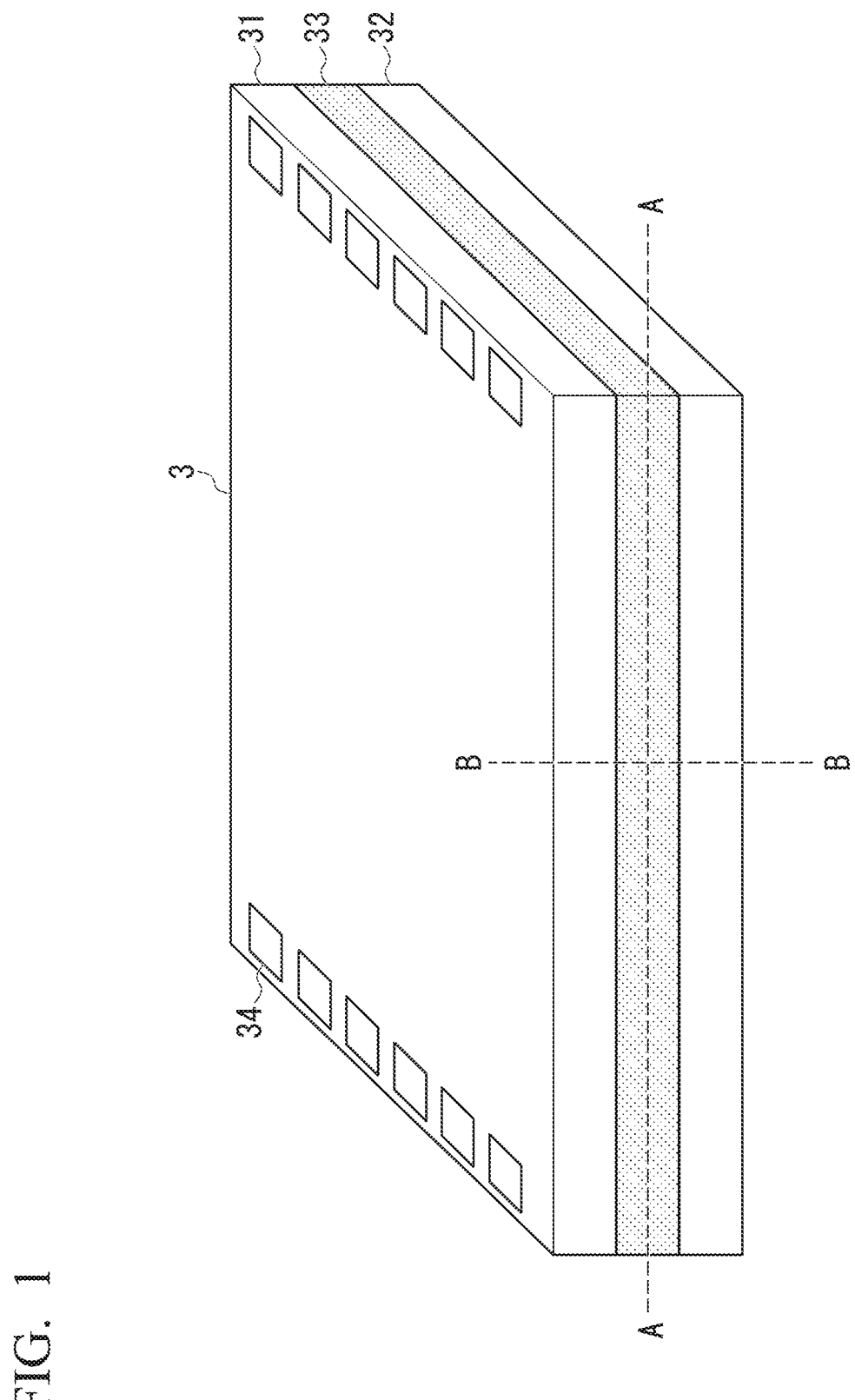
FIG. 1 is an overview diagram illustrating the schematic configuration of a semiconductor device according to an embodiment of the invention.

FIG. 1 is an overview diagram illustrating the schematic configuration of a semiconductor device according to the present embodiment. In FIG. 1, a semiconductor device 3 is constituted of a first semiconductor chip (first substrate) 31 and a second semiconductor chip (second substrate) 32. In the semiconductor device 3, as illustrated in FIG. 1, the first semiconductor chip 31 and the second semiconductor chip 32 are arranged to be spaced apart from each other by a distance equivalent to a connection region 33. One semiconductor device 3 is formed by chip connection parts, which are respectively manufactured on the first semiconductor chip 31 and the second semiconductor chip 32, being electrically connected within the connection region 33. Additionally, external wiring line connection parts 34 manufactured on the first semiconductor chip 31 are connection parts for transmitting and receiving voltages, signals, and the like to/from a circuit outside a package, for example, when the semiconductor device 3 is packaged with ceramics or the like.

In addition, in the semiconductor device 3, a configuration may be adopted in which a space within the connection region 33 that is present after the first semiconductor chip 31 and the second semiconductor chip 32 are connected by the chip connection parts is filled with an insulating member, such as resin or an adhesive. Therefore, the "spaced apart" in the present embodiment includes not only a state where a space is present in addition to a place where the first semiconductor chip 31 and the second semiconductor chip 32 are connected by the chip connection parts but also a state where the insulating member is filled.

First Embodiment

Figure 2:
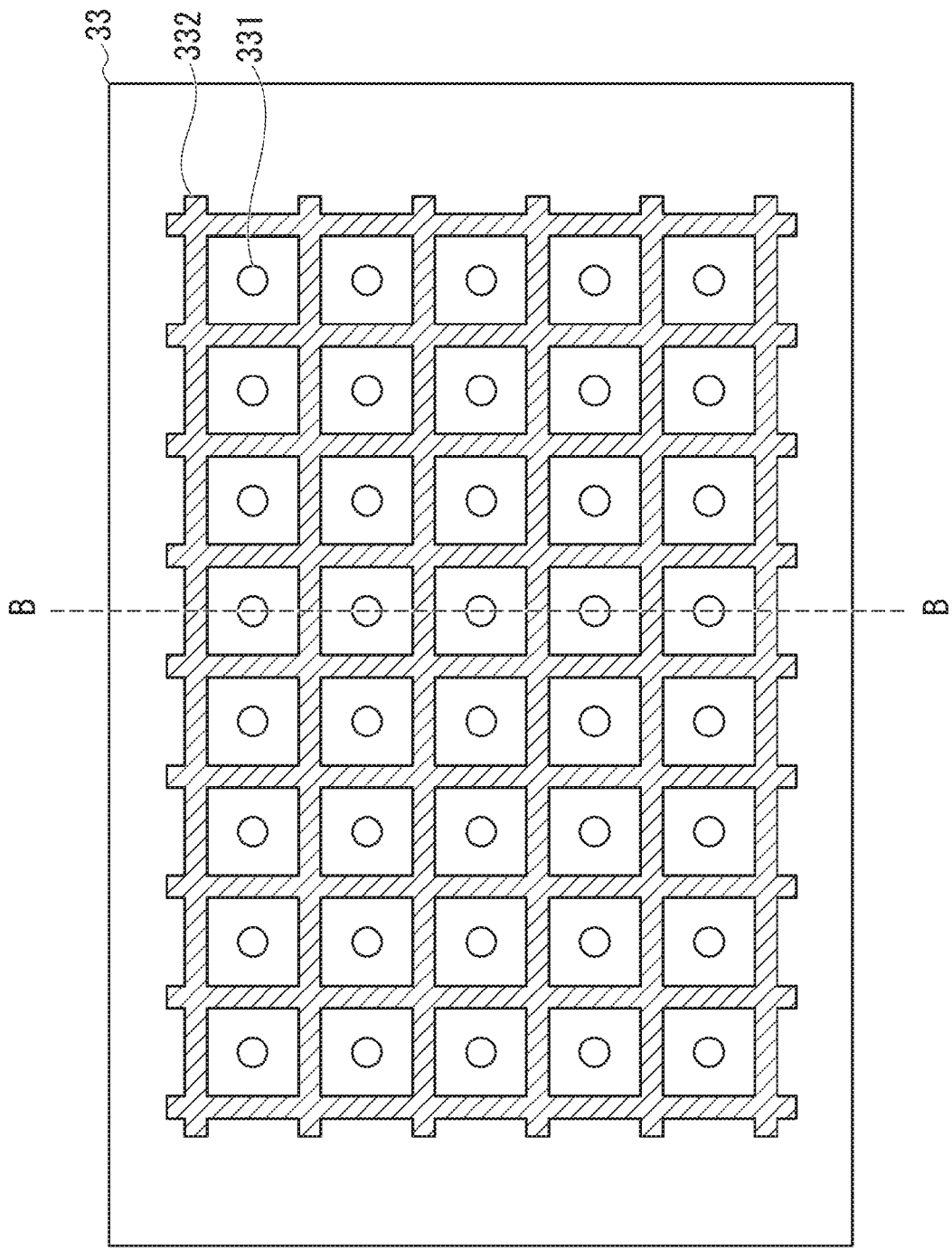
FIG. 2 is a sectional view illustrating the structure of a semiconductor device in a first embodiment of the invention.

Next, the structure of a first embodiment in the semiconductor device 3 illustrated in FIG. 1 will be described. FIG. 2 is a sectional view illustrating the structure of the semiconductor device 3 in the first embodiment. FIG. 2 illustrates a sectional view of the semiconductor device 3 in a portion (A-A section) illustrated by dotted line A-A in the overview diagram of the semiconductor device 3 illustrated in FIG. 1.

As the semiconductor device 3, one semiconductor device 3 is formed by the chip connection parts manufactured on the surface of the first semiconductor chip 31 and the chip connection parts manufactured on the surface of the second semiconductor chip 32 being electrically connected within the connection region 33. As the chip connection parts that are respectively manufactured on surfaces of the first semiconductor chip 31 and the second semiconductor chip 32, for example, bumps made by a vapor deposition method or a plating method are used. In addition, the chip connection parts may be configured to connect an electrode arranged at the first semiconductor chip 31 and an electrode arranged at the second semiconductor chip 32.

The semiconductor device 3 on which the bumps are manufactured as the respective chip connection parts of the first semiconductor chip 31 and the second semiconductor chip 32 will be described below. In addition, a case where the chip connection parts (bumps) that are respectively manufactured on the first semiconductor chip 31 and the second semiconductor chip 32 within the connection region 33 are expressed without being distinguished from each other is also referred to as the "bumps".

In FIG. 2, bumps (connection parts) 331 are illustrated as the connection parts of each of the bumps that are respectively manufactured on the first semiconductor chip 31 and the second semiconductor chip 32. Accordingly, respective signals of the first semiconductor chip 31 and respective signals of the second semiconductor chip 32 are connected electrically, and the first semiconductor chip 31 and the second semiconductor chip 32 transmit and receive signals via the bumps 331.

Electric potentials (hereinafter referred to as "fixed electric potentials") with constant values are provided within the first semiconductor chip 31 and the second semiconductor chip 32. A shield 332 is a noise shielding layer that is connected to a fixed electric potential (for example, the ground) of at least one of the first semiconductor chip 31 and the second semiconductor chip 32. Additionally, the shield 332 is manufactured so as to surround the respective bumps 331. Additionally, the shield 332 is manufactured of the same material (for example, gold (Au) plating, copper (Cu) plating, nickel (Ni) plating, or the like) as the bumps 331. In addition, there is an advantage in that, compared to gold, copper and nickel are inexpensive and processing thereof is simple.

In FIG. 2, spaces that are present between the shield 332 and the bumps 331 are filled with an insulating member, such as resin or an adhesive.

Figure 3:
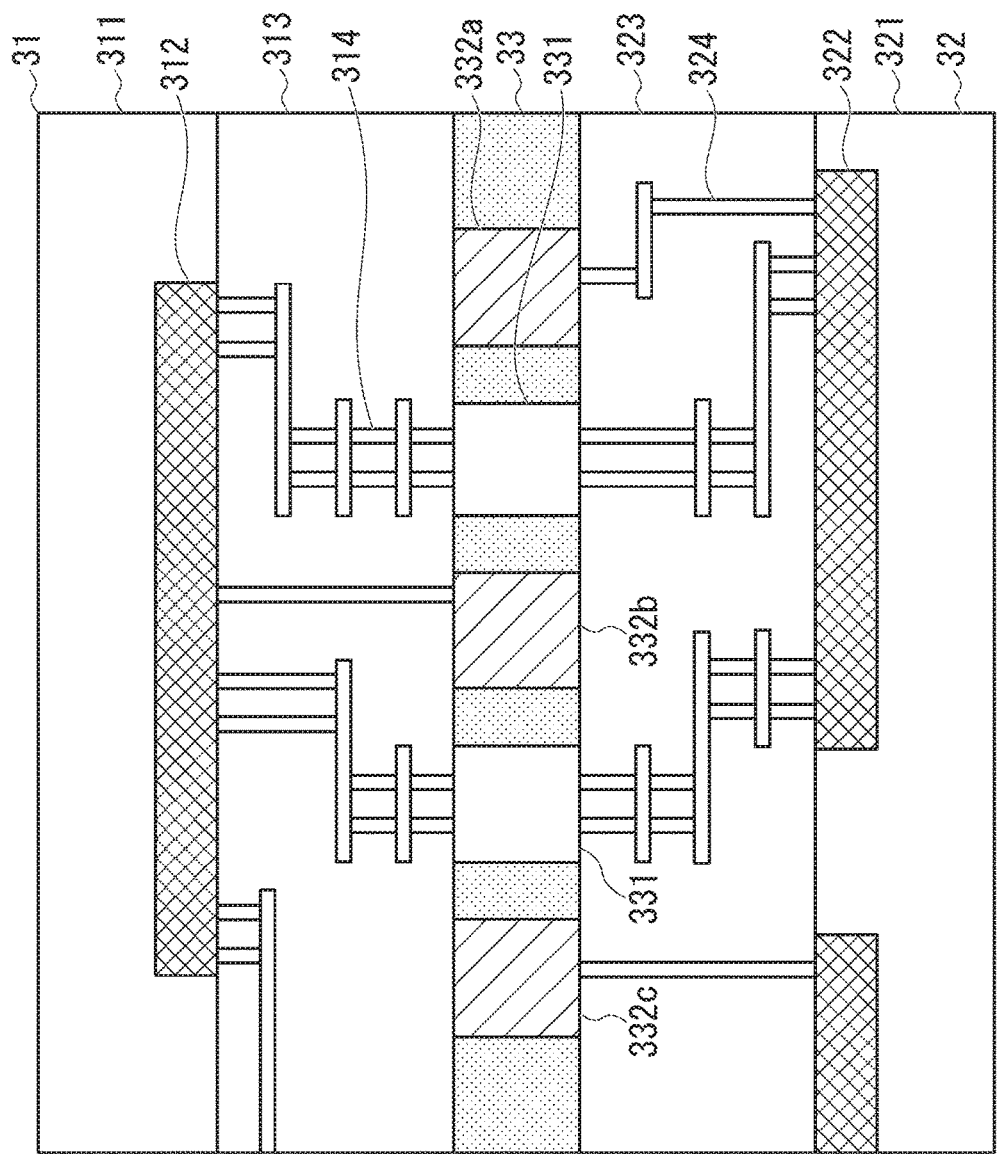
FIG. 3 is another sectional view illustrating the structure of the semiconductor device in the first embodiment.

Next, the structure of the semiconductor device 3 of the first embodiment as seen from another direction will be described. FIG. 3 is another sectional view illustrating the structure of the semiconductor device 3 in the first embodiment. FIG. 3 illustrates an overview diagram of the semiconductor device 3 illustrated in FIG. 1 and a sectional view of the semiconductor device 3 in a portion (B-B section) illustrated by dotted line B-B in the overview diagram of the semiconductor device 3 illustrated in FIG. 2.

The first semiconductor chip 31 is constituted of a first semiconductor layer 311, a first manufacturing region 312, a first wiring layer 313, and first metal wiring 314. Additionally, the second semiconductor chip 32 is constituted of a second semiconductor layer 321, a second device manufacturing region 322, a second wiring layer 323, and second metal wiring 324.

The bumps 331 electrically connect the first metal wiring 314 of the first semiconductor chip 31 and the second metal wiring 324 of the second semiconductor chip 32. The bumps 331 connect a circuit (first circuit), which is manufactured in the first device manufacturing region 312 within the first semiconductor chip 31, and a circuit (second circuit), which is manufactured in the second device manufacturing region 322 within the second semiconductor chip 32, to each other. Accordingly, signals are transmitted and received between the circuits that are respectively manufactured in the device manufacturing regions 312 and 322.

As illustrated in FIG. 2, the shield 332 is manufactured at positions where the bumps 331 are sandwiched (the bumps 331 are surrounded) as can also be understood by looking at the sectional view of the semiconductor device 3 as seen from a direction in which the first semiconductor chip 31 and the second semiconductor chip 32 are stacked. As described above, the shield 332 is connected to, for example, the fixed electric potentials, such as the ground, within the manufactured semiconductor chips. More specifically, the shield 332 is connected to the fixed electric potentials within the first device manufacturing region 312 of the first semiconductor chip 31 and the second device manufacturing region 322 of the second semiconductor chip 32. In FIG. 3, a central shield 332b is connected to the fixed electric potential within the first device manufacturing region 312 of the first semiconductor chip 31. A case where shields 332a and 332c at both ends are respectively connected to fixed electric potentials within respective second device manufacturing regions 322 of the second semiconductor chip 32 is illustrated.

In addition, if the shield 332 is connected to the fixed electric potential within the device manufacturing region 312 or 322 of either the first semiconductor chip 31 or the second semiconductor chip 32, noise mixed in signals connected via the bumps 331 can be reduced. Therefore, as illustrated in FIG. 3, it is not necessary that the shield 332 be electrically connected to the fixed electric potentials of both of the first semiconductor chip 31 and the second semiconductor chip 32.

In this way, in the semiconductor device 3 of the first embodiment, the shield 332 is manufactured around regions where the bumps 331 are manufactured. Accordingly, in the semiconductor device 3 of the first embodiment, even in a state where a gap between the first semiconductor chip 31 and the second semiconductor chip 32 is hollow, noise, which is mixed in the signals transmitted and received between the circuit manufactured in the first device manufacturing region 312 within the first semiconductor chip 31 and the circuit manufactured in the second device manufacturing region 322 within the second semiconductor chip 32 via the bumps 331, can be reduced, that is, noise can be shielded.

Additionally, in the semiconductor device 3 of the first embodiment, the shield 332 is manufactured of the same material as that of the bumps 331. For this reason, in the semiconductor device 3 of the first embodiment, the shield 332 can be manufactured by the same manufacturing process as the manufacturing process for manufacturing the bumps 331. Accordingly, in the semiconductor device 3 of the first embodiment, the shield 332 can be easily manufactured.

Second Embodiment

Figure 4:
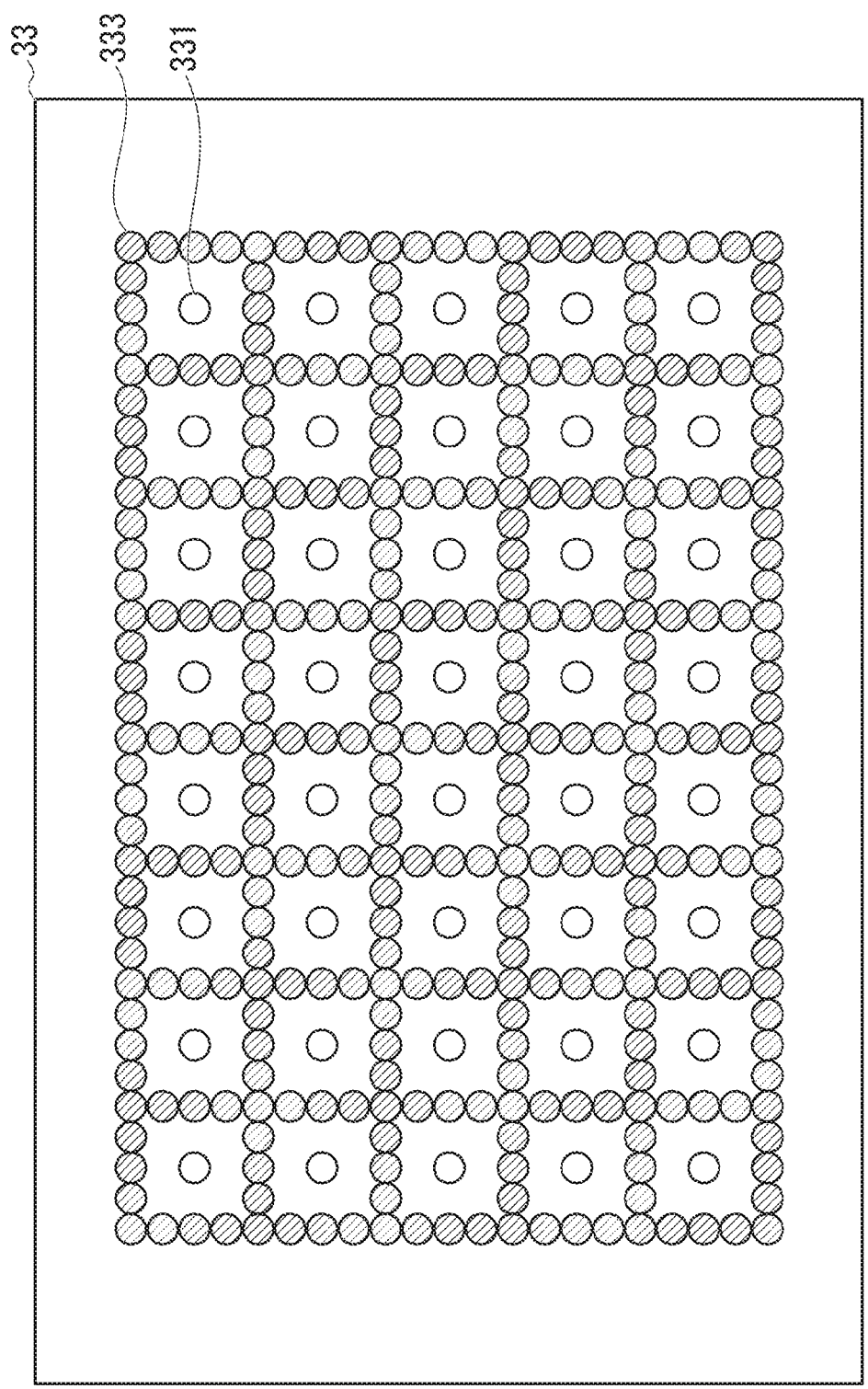
FIG. 4 is a sectional view illustrating the structure of a semiconductor device in a second embodiment of the invention.

Next, the structure of a second embodiment in the semiconductor device 3 illustrated in FIG. 1 will be described. FIG. 4 is a sectional view illustrating the structure of the semiconductor device 3 in the second embodiment. FIG. 4 illustrates a sectional view of the semiconductor device 3 in a portion (A-A section) illustrated by dotted line A-A in the overview diagram of the semiconductor device 3 illustrated in FIG. 1, similar to the structure of the semiconductor device 3 of the first embodiment illustrated in FIG. 2. Therefore, in FIG. 4, the same reference numerals are given to the same structure as the structure of the semiconductor device 3 of a first embodiment illustrated in FIG. 2.

The difference between the structure of the semiconductor device 3 of the second embodiment and the structure of the semiconductor device 3 of the first embodiment is only that the shield 332 in the semiconductor device 3 of the first embodiment is replaced with a shield 333. Therefore, in the following description, the description of the same structure as that of the semiconductor device 3 of the first embodiment will be omitted, and the structure of the shield 333 different from that of the semiconductor device 3 of that first embodiment will be described.

Fixed electric potentials (for example, the ground) are provided within the first semiconductor chip 31 and the second semiconductor chip 32. The shield 333 is a noise shielding layer that is connected to the fixed electric potential (for example, the ground) of at least one of the first semiconductor chip 31 and the second semiconductor chip 32, similar to the shield 332 in the semiconductor device 3 of the first embodiment. Additionally, when the semiconductor device 3 is seen in the stacking direction of the first semiconductor chip 31 and the second semiconductor chip 32, the shield 333 is manufactured so as to surround the respective bumps 331. As can be seen from FIG. 4, the shield 333 is manufactured so that sub-shields, which are unit shielding layers with the same shape as the shape of the bumps 331, that is, the shape of connecting surfaces of the bumps that are respectively manufactured in the first semiconductor chip 31 and the second semiconductor chip 32, stretch in a line. In this case, the sub-shields that manufacture the shield 333 are also manufactured of the same material as that of the bumps 331.

In addition, also in the semiconductor device 3 of the second embodiment, the respective sub-shields that manufacture the shield 333 can reduce noise mixed in the signals connected via the bumps 331, if the sub-shields are connected to the fixed electric potential within the device manufacturing region of either the first semiconductor chip 31 or the second semiconductor chip 32. For this reason, it is not necessary that the respective sub-shields that manufacture the shield 333 be electrically connected to the fixed electric potentials of both of the first semiconductor chip 31 and the second semiconductor chip 32, similar to the shield 332 in the first embodiment.

In this way, in the semiconductor device 3 of the second embodiment, the shield 333 is manufactured around regions where the bumps 331 are manufactured, similar to the semiconductor device 3 of the first embodiment. Accordingly, also in the semiconductor device 3 of the second embodiment, similar to the semiconductor device 3 of the first embodiment, even in a state where a gap between the first semiconductor chip 31 and the second semiconductor chip 32 is hollow, noise, which is mixed in the signals transmitted and received between the first semiconductor chip 31 and the second semiconductor chip 32 via the bumps 331, can be reduced.

Additionally, in the semiconductor device 3 of the second embodiment, the respective sub-shields that manufacture the shield 333 are manufactured of the same material as and the same shape as the bumps 331. For this reason, in the semiconductor device 3 of the second embodiment, the shield 333 can be manufactured by the same manufacturing process as the manufacturing process for manufacturing the bumps 331. Accordingly, in the semiconductor device 3 of the second embodiment, it is not necessary to newly provide an exclusive manufacturing process for manufacturing the shield 333, and the shield 333 can be easily manufactured.

Figure 5A:
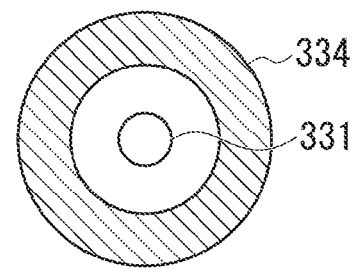
FIG. 5A is a view illustrating an example of the shape of a shield in the semiconductor device of the present embodiment.
Figure 5B:
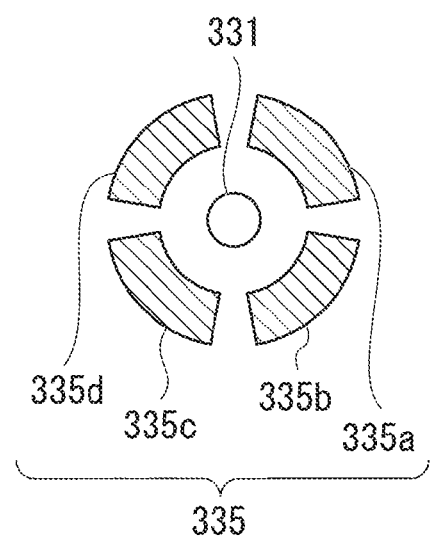
FIG. 5B is a view illustrating an example of the shape of the shield in the semiconductor device of the present embodiment.
Figure 5C:
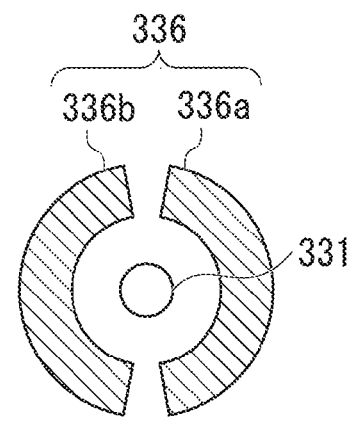
FIG. 5C is a view illustrating an example of the shape of the shield in the semiconductor device of the present embodiment.

In addition, the shapes of the shields in the semiconductor device 3 are not limited to the same shapes as the shield 332 illustrated in the first embodiment and the shield 333 illustrated in the second embodiment, and noise mixed in the signals transmitted and received via the bumps 331 can be shielded if the shields are adjacent to the bumps 331 and are manufactured at positions where the bumps 331 are sandwiched (the bumps 331 are surrounded). Here, several examples regarding the shapes of the shields in the semiconductor device 3 will be described. FIGS. 5A to 5C are views illustrating examples of the shapes of shields in the semiconductor device 3 of the present embodiment. In addition, the shapes of the shields corresponding to one bump 331 are illustrated in FIGS. 5A to 5C.

The shape of a shield 334 manufactured so as to surround the periphery of a bump 331 is illustrated in FIG. 5A. The shield 334 is also connected to the fixed electric potential(s) within the device manufacturing region(s) 312 or/and 322 of any one or both of the first semiconductor chip 31 and the second semiconductor chip 32.

Additionally, the shape of a shield 335 that is constituted of four sub-shields 335a to 335d (a first unit shielding layer to a fourth unit shielding layer) manufactured at orthogonal positions where the periphery of the bump 331 is surrounded from four directions is illustrated in FIG. 5B. The shield 335 is also connected to the fixed electric potential(s) within the device manufacturing region(s) of any one or both of the first semiconductor chip 31 and the second semiconductor chip 32. In addition, the sub-shield 335a to the sub-shield 335d illustrated in FIG. 5B are respectively not limited to those manufactured on the same semiconductor chip. That is, any of the sub-shield 335a to the sub-shield 335d may be manufactured on the first semiconductor chip 31, and the sub-shield 335a to the sub-shield 335d that are not manufactured on the first semiconductor chip 31 may be manufactured on the second semiconductor chip 32.

Additionally, the shape of a shield 336 that is constituted of two sub-shields 336a and 336b (a first unit shielding layer and a second unit shielding layer) manufactured at positions where the periphery of the bump 331 is surrounded from two directions is illustrated in FIG. 5C. The shield 336 is also connected to the fixed electric potential(s) within the device manufacturing region(s) of any one or both of the first semiconductor chip 31 and the second semiconductor chip 32. In addition, the sub-shield 336a to the sub-shield 336b illustrated in FIG. 5C are respectively not limited to those manufactured on the same semiconductor chip. For example, the sub-shield 336a may be manufactured on the first semiconductor chip 31, and the sub-shield 336b may be manufactured on the second semiconductor chip 32.

Figure 6:
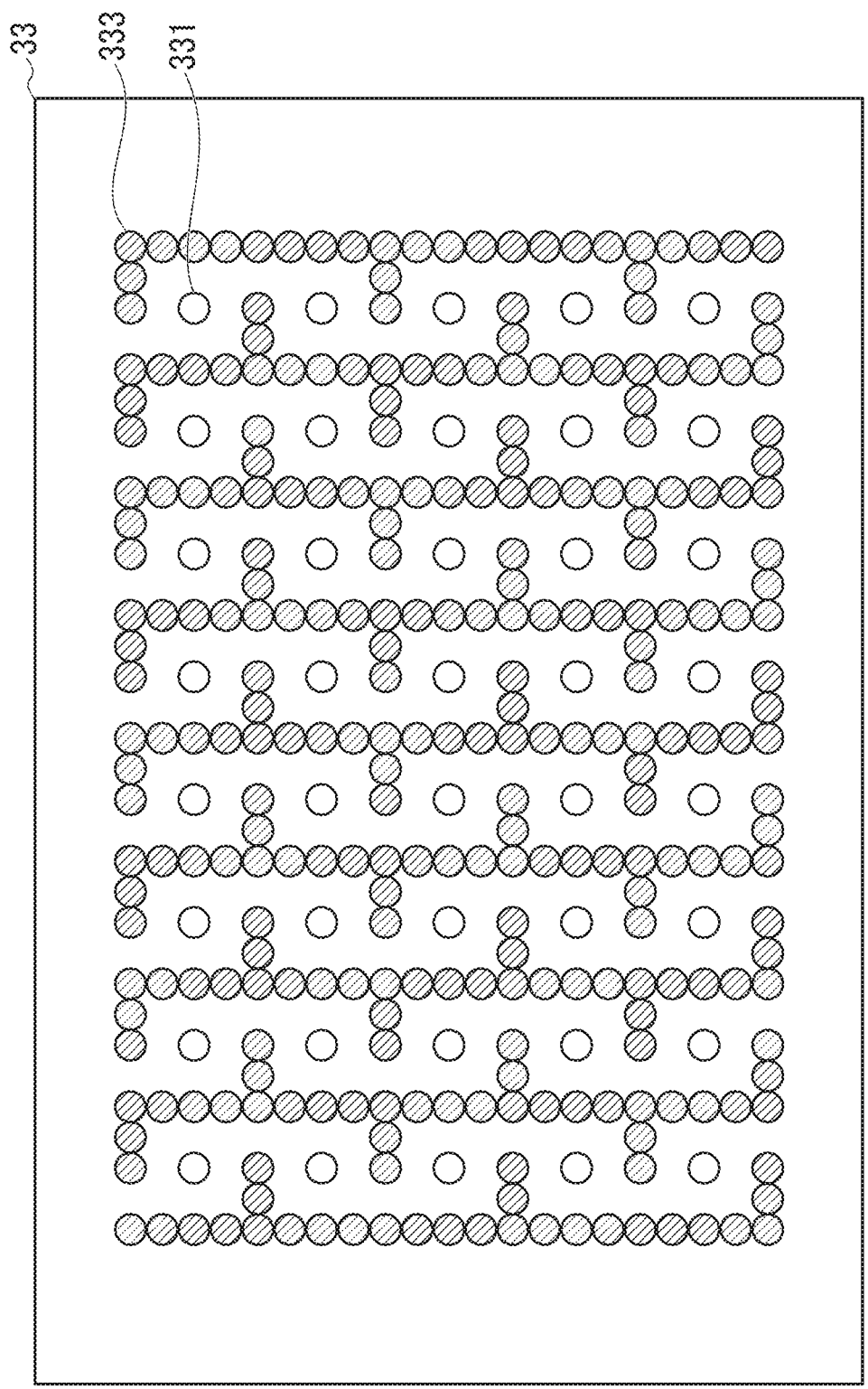
FIG. 6 is a sectional view illustrating another example of the shape of the shield in the semiconductor device of the present embodiment.

In this way, in the semiconductor device 3 of the present embodiment, shields with various shapes can be manufactured. In addition, the shield 332 manufactured in a lattice shape is illustrated in the semiconductor device 3 of the first embodiment, and the shield 333 in which the plurality of sub-shields of the same shape as the bumps 331 are arranged in a lattice shape is illustrated in the semiconductor device 3 of the second embodiment. For example, as illustrated in FIG. 6, a shape in which gaps such that respective lattices are connected are present may be adopted. When the shields are manufactured in the shape in which the gaps as illustrated in FIG. 6 are present and in the shape in which the gaps are present between the respective sub-shields as illustrated in FIG. 5B or 5C, these gaps can also be used, for example, when spaces that are present between the bumps 331 and a shield are filled with an insulating member. That is, if an insulating member with flowability that can move (flow) to regions of other bumps 331 from the gaps that are present between the shields or between the respective sub-shields is used, all the spaces that are present between the bumps 331 and the shield can be filled up with an insulating member by pouring an insulating member from the gaps even after the first semiconductor chip 31 and the second semiconductor chip 32 are connected by the bumps 331.

<Imaging Device>

Figure 7:
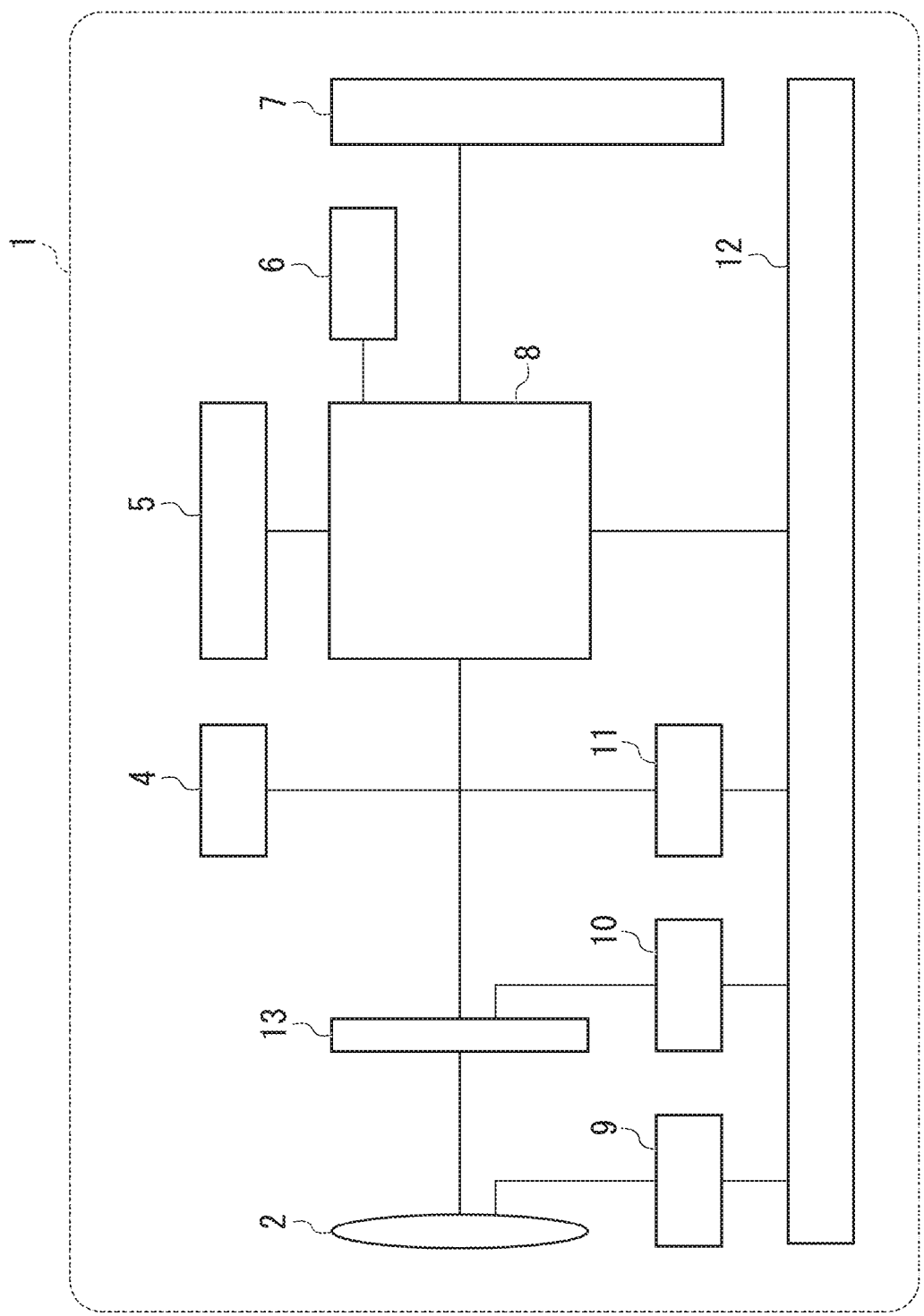
FIG. 7 is a block diagram illustrating the schematic configuration of an imaging device on which a solid state imaging device having the structure of the semiconductor device of the present embodiment applied thereto is mounted.

Next, a case where the structure of the semiconductor device 3 of the present embodiment has been applied to the solid state imaging device mounted on the imaging device will be described as an example in which the structure of the semiconductor device 3 of the present embodiment is applied. FIG. 7 is a block diagram illustrating the schematic configuration of the imaging device (for example, a mirrorless digital camera) on which the solid state imaging device having the structure of the semiconductor device 3 of the present embodiment applied thereto is mounted. The respective constituent elements illustrated herein can be realized by elements including a CPU and memories of a computer in software and can be realized by a computer program or the like in hardware. However, the respective constituent elements are illustrated herein as functional blocks realized by the cooperation thereof. Therefore, a person skilled in the art ought to be able to understand that these functional blocks can be realized in various forms by the combination of hardware and software.

The imaging device 1 illustrated in FIG. 7 is constituted of a lens unit part 2, a solid state imaging device 13, a light emission device 4, a memory 5, a recording device 6, a display device 7, an image signal processing circuit 8, a lens control device 9, an image sensor control device 10, a light emission control device 11, and a camera control device 12.

In the lens unit part 2, driving of zooming, focusing, diaphragming, and the like are controlled by the lens control device 9, and a subject image is formed on the solid state imaging device 13.

The solid state imaging device 13 is the solid state imaging device 13 with a structure in which the structure of the semiconductor device 3 of the present embodiment has been applied. The solid state imaging device 13 is an MOS type solid state imaging device that is driven and controlled by the image sensor control device 10 and outputs image signals according to the received light quantity of photographic subject light that has entered the solid state imaging device 13 via the lens unit part 2. In addition, detailed description regarding the solid state imaging device 13 will be described below.

The light emission device 4 is a device, such as a stroboscope or a flash, which is driven and controlled by the light emission control device 11 and which applies the light emitted from the light emission device 4 to a photographic subject, thereby adjusting the light reflected from the photographic subject.

The image signal processing circuit 8 processes signal amplification, conversion into image data, various correction, compression of image data, and the like, on the image signals output from the solid state imaging device 13. In addition, the image signal processing circuit 8 uses the memory 5 as temporary storage means of the image data in each processing.

The recording device 6 is a detachable recording medium, such as a semiconductor memory, and performs recording or reading of the image data.

The display device 7 is a display device, such as liquid crystal, which displays an image that is formed on the solid state imaging device 13 and is based on the image data processed by the image signal processing circuit 8 or the image data read from the recording device 6.

The camera control device 12 is a control device that controls the overall imaging device 1. Additionally, the camera control device 12 controls the lens control device 9, thereby controls driving of zooming, focusing, diaphragming, and the like using the lens unit part 2. Additionally, the camera control device 12 controls the image sensor control device 10 and the light emission control device 11, thereby cooperatively controlling the solid state imaging device 13 and the light emission device 4.

<Solid State Imaging Device>

Figure 8:
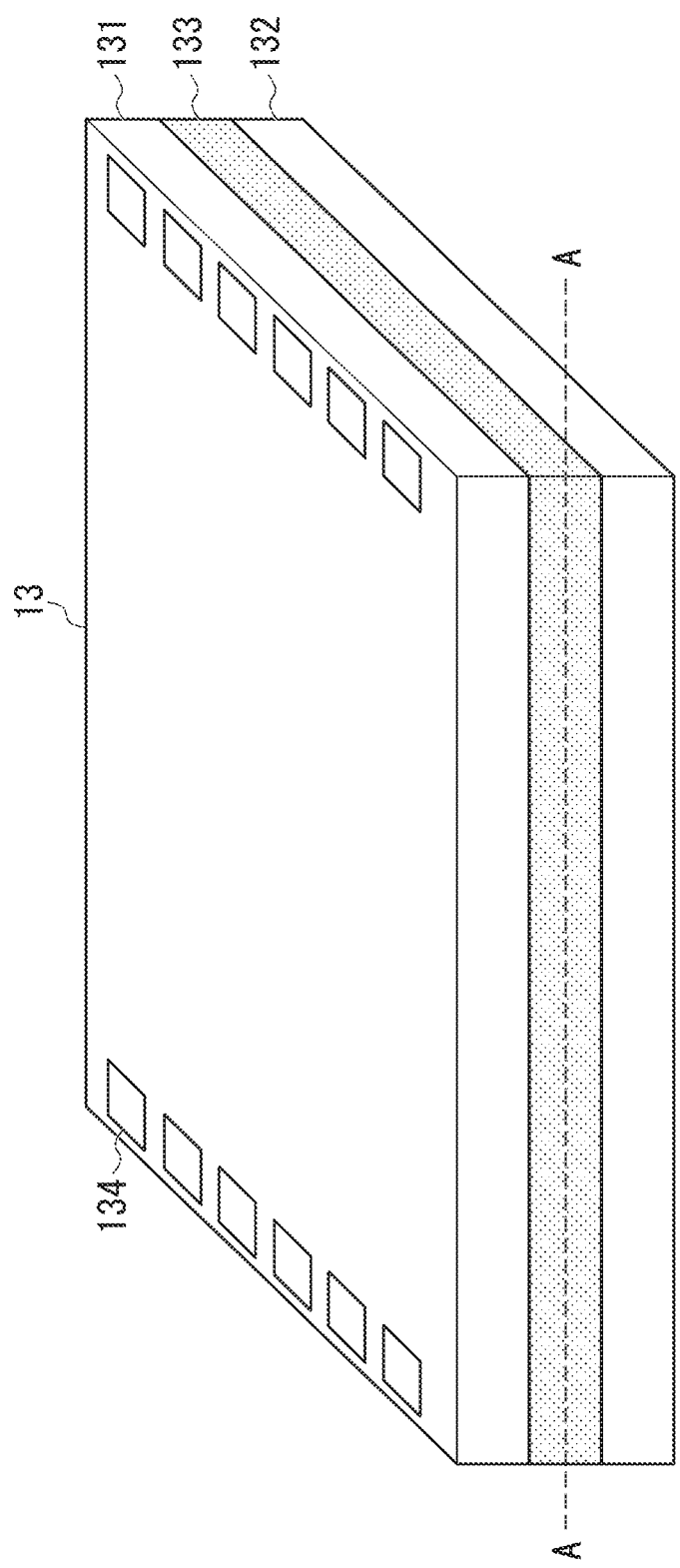
FIG. 8 is an overview diagram illustrating the schematic configuration of the solid state imaging device having the structure of the semiconductor device of the present embodiment applied thereto.

Next, the solid state imaging device 13 mounted on the imaging device 1 will be described. First, the structure of the solid state imaging device 13 will be described. FIG. 8 is an overview diagram illustrating the schematic configuration of the solid state imaging device 13 having the structure of the semiconductor device 3 of the present embodiment applied thereto. The solid state imaging device 13, as described above, has the structure in which the structure of the semiconductor device 3 of the present embodiment has been applied. More specifically, as illustrated in FIG. 8, the solid state imaging device 13 is constituted of a pixel chip 131 and a circuit chip 132. The pixel chip 131 and the circuit chip 132 are electrically connected via a connection region 133. Additionally, voltages, signals, and the like are transmitted to and received from a circuit outside a package by external wiring line connection parts 134 manufactured on the pixel chip 131.

The pixel chip 131 is a chip in which normal pixels including a photoelectric conversion part that converts entered photographic subject light (incident light) into electrical signals are arrayed in two dimensions. The respective pixels included in the pixel chip 131 are driven and controlled by signals within the pixel chip 131 or signals transmitted from the circuit chip 132. The respective pixels included in the pixel chip 131 transmit the converted electrical signals to the circuit chip 132 as pixel signals.

The circuit chip 132 is a chip including a processing circuit that receives electrical signals (pixel signals) transmitted from the respective pixels included in the pixel chip 131, and performs processing on the received electrical signals (pixel signals).

As the processing performed on the pixel signals received by a processing circuit include in the circuit chip 132, there is temporary memory (holding) and integration of the pixel signals, simple arithmetic processing on the pixel signals, or the like. Additionally, the circuit chip 132 transmits signals for driving and controlling the pixel chip 131 to the pixel chip 131.

The connection region 133 is a region where bumps for electrically connecting the pixel chip 131 and the circuit chip 132 are manufactured. Additionally, a shield for reducing noise mixed in the signals (pixel signals or the like) transmitted and received between the pixel chip 131 and the circuit chip 132 via bumps is manufactured within the connection region 133. The pixel chip 131 and the circuit chip 132 transmit and receive signals (pixel signals or the like) via the bumps manufactured in the connection region 133.

Third Embodiment

Figure 9:
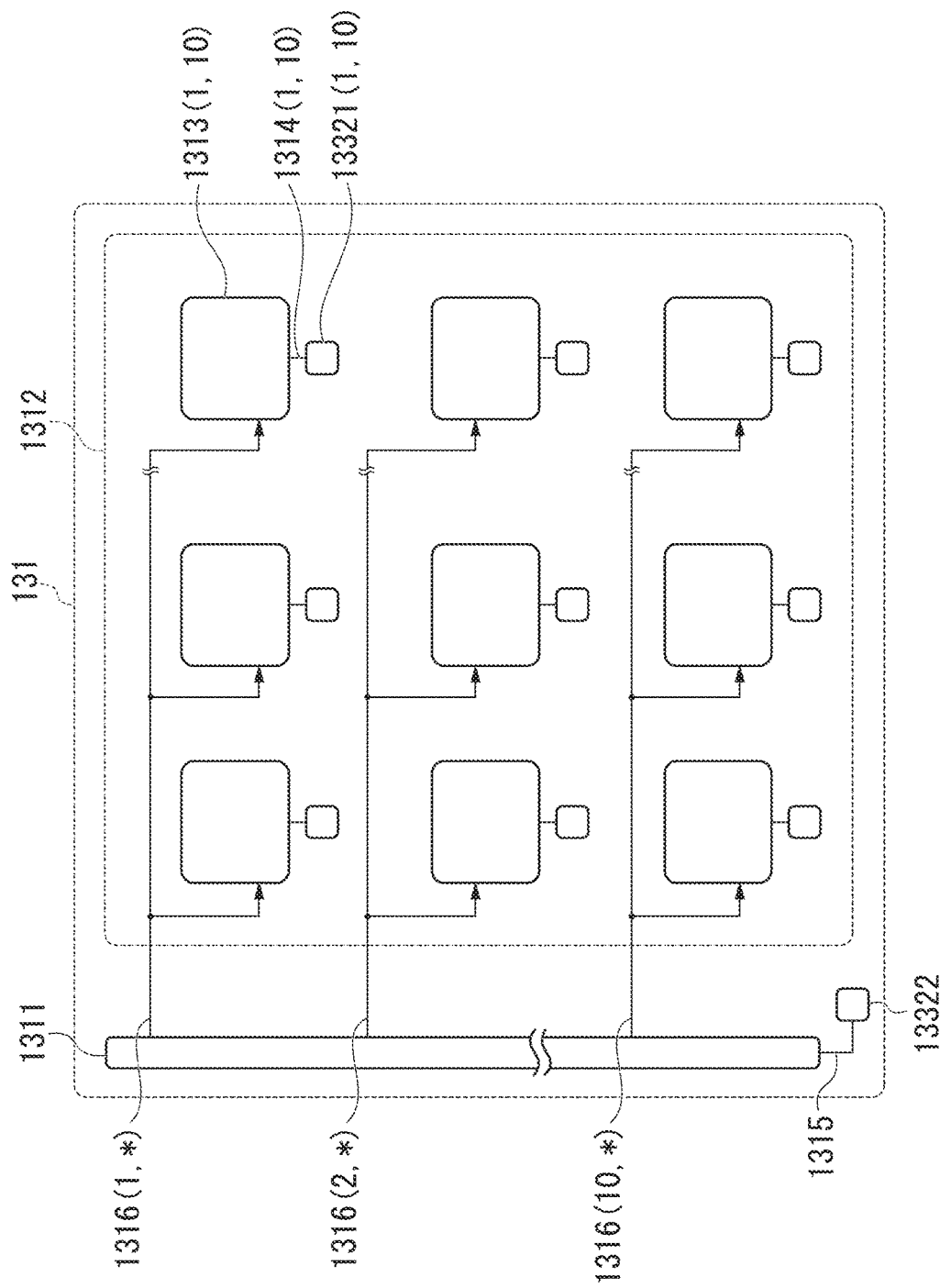
FIG. 9 is a circuit diagram illustrating the schematic configuration of a pixel chip in a solid state imaging device in a third embodiment of the invention.

Next, the configuration of the solid state imaging device 13 will be described. First, the pixel chip 131 in the solid state imaging device 13 of the third embodiment will be described. FIG. 9 is a circuit diagram illustrating the schematic configuration of the pixel chip 131 within the solid state imaging device 13 in the third embodiment. In FIG. 9, the pixel chip 131 includes a first circuit constituted of a pixel chip vertical scanning circuit 1311, a pixel array part 1312, unit pixels 1313, pixel signal lines 1314, a pixel chip vertical scanning circuit signal line 1315, and pixel control lines 1316, bumps 13321 for pixel signals, and a bump 13322 for a control signal. In addition, in the pixel chip 131 illustrated in FIG. 9, the example of the pixel array part 1312 in which the plurality of unit pixels 1313 are two-dimensionally arranged in a 10-by-10 matrix.

In addition, in the pixel chip 131 illustrated in FIG. 9, numbers and symbols within "parentheses ( )" expressed behind the respective reference signs represent row numbers and column numbers that respectively correspond to the unit pixels 1313 arranged within the pixel chip 131. The first numbers within the "parentheses ( )" show row numbers, and the final numbers within the "parentheses ( )" show column numbers. For example, a unit pixel 1313 in a second row and a third column is expressed as a unit pixel 1313 (2, 3). Additionally, when only either the row numbers or the column numbers, that is, the same row numbers or the same column numbers are expressed, the same row numbers or the same column numbers are expressed by figures, and the row numbers or the column numbers that are not the same are expressed by "asterisks (*)". For example, a pixel control line 1316 in a second row is expressed as a pixel control line 1316 (2, *). Additionally when both the row numbers and the column numbers are not specified, the "parentheses ( )" behind the respective reference signs are not written.

The pixel chip vertical scanning circuit 1311 controls the respective unit pixels 1313 within the pixel array part 1312 in accordance with a control signal that is transmitted from the circuit chip 132 and are input to the pixel chip vertical scanning circuit signal line 1315 via the bump 13322 for a control signal, and makes pixel signals of the respective unit pixel 1313 output to the corresponding respective pixel signal lines 1314. The pixel chip vertical scanning circuit 1311 outputs the control signal for controlling the unit pixels 1313 to the pixel control lines 1316 for each row of the unit pixels 1313 arranged at the pixel array part 1312.

The respective unit pixels 1313 within the pixel array part 1312 outputs reset signals when being reset and electrical signals according to the received light quantity (quantity of rays) of photographic subject light that has entered the pixel signal lines 1314, as pixel signals. The pixel signals output from the unit pixels 1313 to the pixel signal lines 1314 are transmitted to the circuit chip 132 via the bumps 13321 for pixel signals.

The pixel signal lines 1314 and the pixel chip vertical scanning circuit signal line 1315 are connected to the circuit chip 132 via the bumps 13321 for pixel signals or the bump 13322 for a control signal. The pixel chip 131 and the circuit chip 132 transmit and receive various signals required for driving and controlling of the pixel chip 131, and the pixel signals output by the respective unit pixels 1313 within the pixel chip 131, through the pixel signal lines 1314 and the pixel chip vertical scanning circuit signal line 1315.

Figure 10:
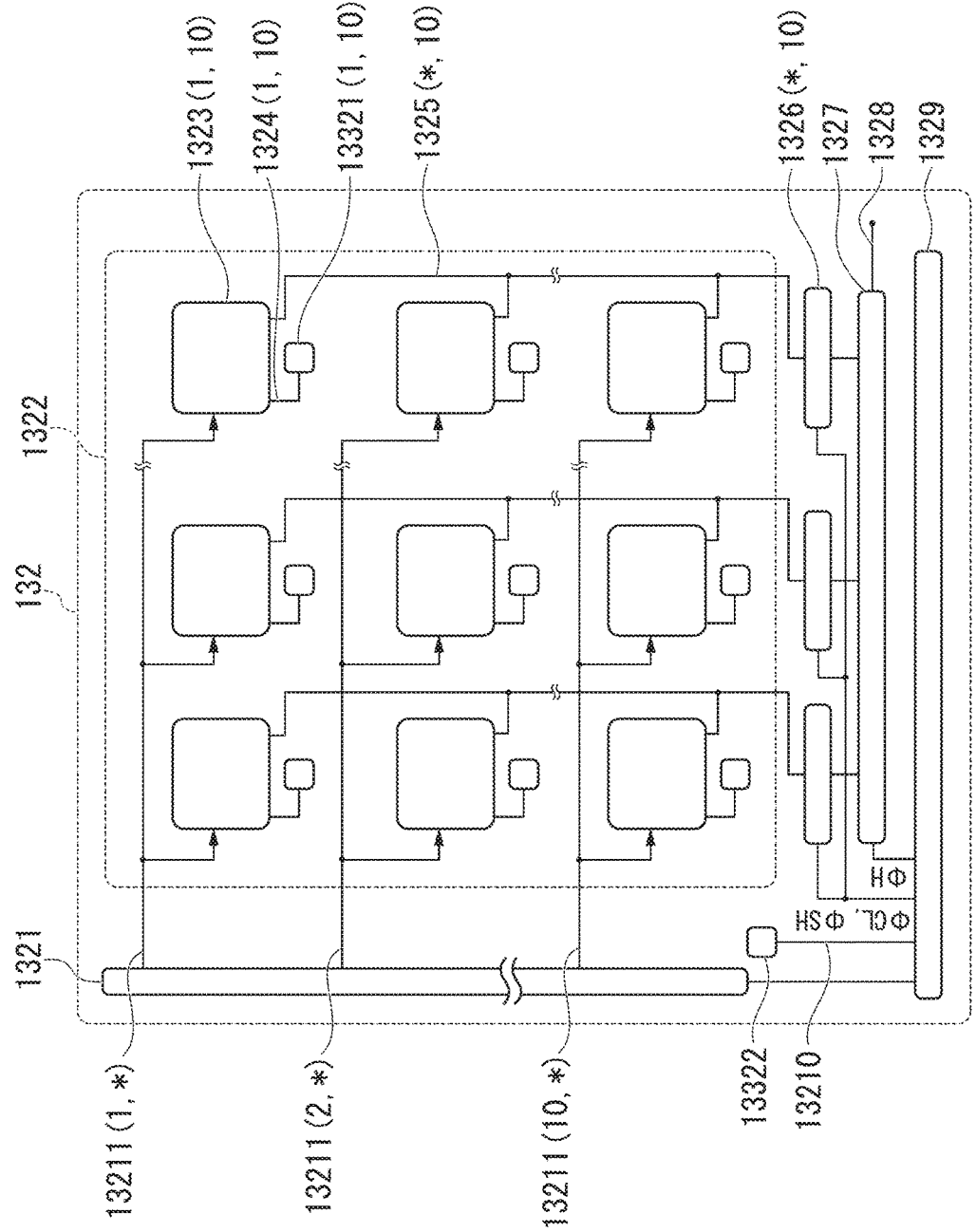
FIG. 10 is a circuit diagram illustrating the schematic configuration of the circuit chip in the solid state imaging device in the third embodiment.

Next, the circuit chip 132 in the solid state imaging device 13 of the third embodiment will be described. FIG. 10 is a circuit diagram illustrating the schematic configuration of the circuit chip 132 within the solid state imaging device 13 in the third embodiment. In FIG. 10, the circuit chip 132 includes a second circuit constituted of a pixel signal processing chip vertical scanning circuit 1321, a memory array part 1322, unit memories 1323, memory signal lines 1324, pixel signal processing chip vertical signal lines 1325, pixel signal processing chip column processing circuits 1326, a pixel signal processing chip horizontal scanning circuit 1327, a pixel signal processing chip horizontal scanning circuit signal line 1328, an image sensor control circuit 1329, an image sensor control circuit signal line 13210, and memory control lines 13211, bumps 13321 for pixel signals, and a bump 13322 for a control signal. In addition, in the circuit chip 132 illustrated in FIG. 10, an example of the memory array part 1322 in which the plurality of unit memories 1323 are two-dimensionally arranged in 10-by-10 matrix.

In addition, in the circuit chip 132 illustrated in FIG. 10, numbers and symbols within "parentheses ( )" expressed behind the respective reference signs represent row numbers and column numbers that respectively correspond to the unit memories arranged within the circuit chip 132. The way of expressing these is the same as that of the pixel chip 131 illustrated in FIG. 9.

The pixel signal processing chip vertical scanning circuit 1321 controls the respective unit memories 1323 within the memory array part 1322 according to a control signal input from the image sensor control circuit 1329, and makes memory signals of the respective unit memories 1323 output to the corresponding respective pixel signal processing chip vertical signal lines 1325. The pixel signal processing chip vertical scanning circuit 1321 outputs the control signal for controlling the unit memories 1323 to the memory control lines 13211 to each row of the unit memories 1323 arranged at the memory array part 1322.

The pixel signals, which are output from the corresponding respective unit pixels 1313 within the pixel array part 1312 included in the pixel chip 131 and are transmitted to the memory signal lines 1324 via the bumps 13321 for pixel signals, are input to the respective unit memories 1323 within the memory array part 1322. Then, the respective unit memories 1323 hold the electrical signals according to the input pixel signals, and outputs the electrical signals to the pixel signal processing chip vertical signal lines 1325 with the held electrical signals as memory signals.

The pixel signal processing chip column processing circuits 1326 perform processing on the memory signals output from the unit memories 1323. In the processing on the memory signals using the pixel signal processing chip column processing circuits 1326, subtraction (difference processing) of signals is performed on the basis of clamp pulses ΦCL and sample hold pulses ΦSH that are input from the image sensor control circuit 1329. Moreover, processing, such as amplification or comparison of signals, is included in the processing performed by the pixel signal processing chip column processing circuits 1326. Additionally, the pixel signal processing chip column processing circuits 1326 include current source loads connected to the pixel signal processing chip vertical signal lines 1325.

The pixel signal processing chip horizontal scanning circuit 1327 sequentially reads the memory signals after the processing, which are output from the pixel signal processing chip column processing circuits 1326, to the pixel signal processing chip horizontal scanning circuit signal line 1328, on the basis of horizontal scanning pulses OH input from the image sensor control circuit 1329.

The image sensor control circuit 1329 controls the pixel signal processing chip vertical scanning circuit 1321, the pixel signal processing chip column processing circuits 1326, the pixel signal processing chip horizontal scanning circuit 1327, and the pixel chip vertical scanning circuit 1311 within the pixel chip 131.

The memory signal lines 1324 and the image sensor control circuit signal line 13210 are connected to the pixel chip 131 via the bumps 13321 for pixel signals, or the bump 13322 for a control signal. The pixel chip 131 and the circuit chip 132 transmit and receive various signals required for driving and controlling of the pixel chip 131, and the pixel signals output by the respective unit pixels 1313 within the pixel chip 131, through the memory signal lines 1324 and the image sensor control circuit signal line 13210.

The solid state imaging device 13 controls the pixel signals according to the received light quantity of the entered photographic subject light, through the control using the image sensor control circuit 1329, the pixel signal processing chip vertical scanning circuit 1321, the pixel signal processing chip column processing circuits 1326, the pixel signal processing chip horizontal scanning circuit 1327, and the pixel chip vertical scanning circuit 1311.

Figure 11:
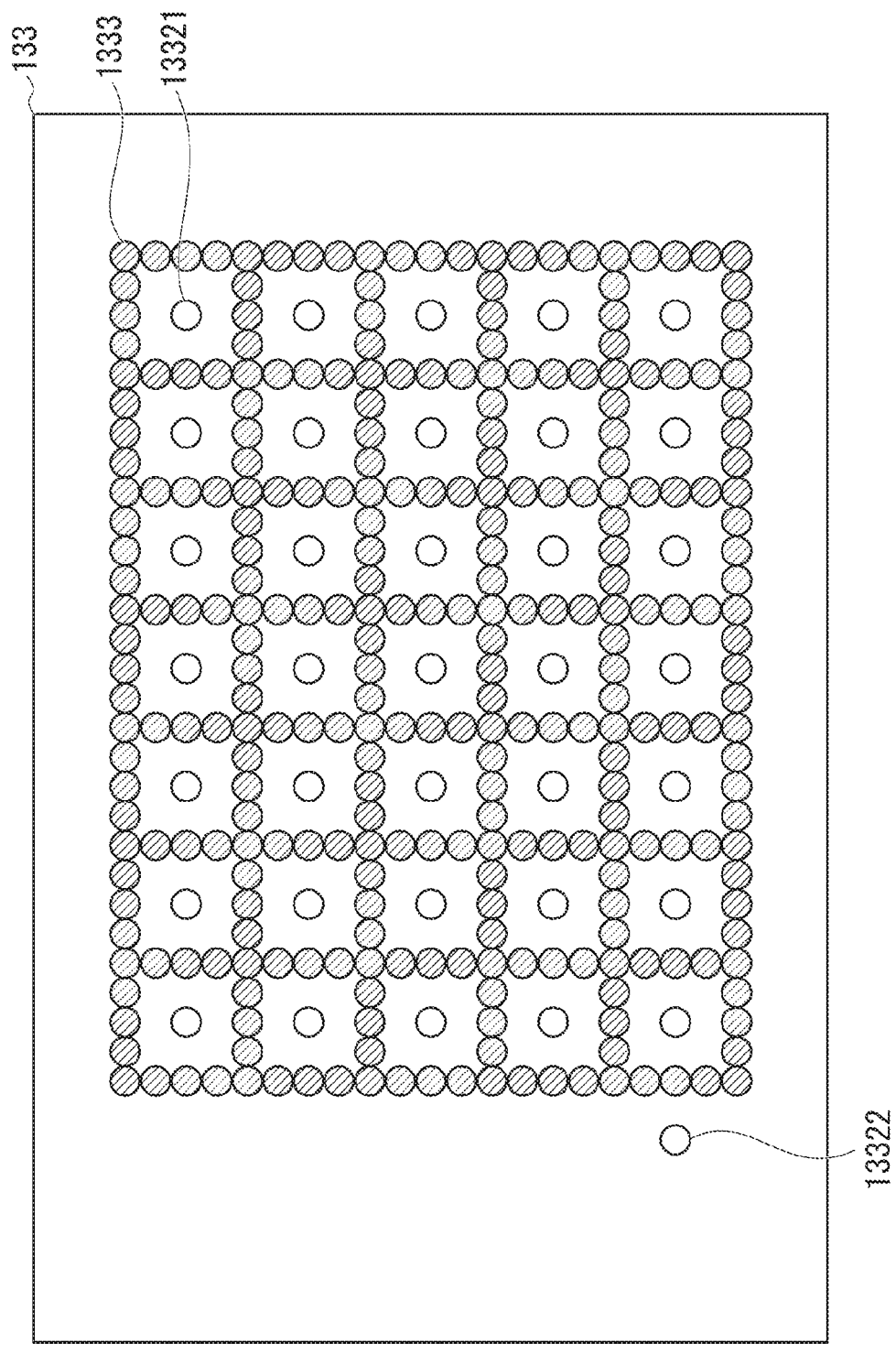
FIG. 11 is a sectional view illustrating the structure of the solid state imaging device in the third embodiment.

Next, the structure of the solid state imaging device 13 of the third embodiment will be described. FIG. 11 is a sectional view illustrating the structure of the solid state imaging device 13 in the third embodiment. FIG. 11 illustrates the sectional view of the solid state imaging device 13 in a portion (A-A section) illustrated by dotted line A-A in the overview diagram of the solid state imaging device 13 illustrated in FIG. 8. As illustrated in FIG. 11, in the solid state imaging device 13, similar to the semiconductor device 3 of a second embodiment illustrated in FIG. 4 a shield 1333 is manufactured so that a plurality of sub-shields with the same shape as the bumps 13321 for pixel signals or the bump 13322 for a control signal stretch in a line.

Fixed voltages are provided within the pixel chip 131 and the circuit chip 132. The shield 1333 is a noise shielding layer that is connected to the fixed electric potential of at least one of the pixel chip 131 and the circuit chip 132, similar to the shield 333 in the semiconductor device 3 of the second embodiment illustrated in FIG. 4. Additionally, as seen in the stacking direction of the pixel chip 131 and the circuit chip 132, the shield 1333 is manufactured so as to surround the respective bumps 13321 for pixel signals. The respective sub-shields that manufacture the shield 1333 are also manufactured of the same material as that of the bumps 13321 for pixel signals. In addition, similar to the respective sub-shields that manufacture the shield 333 in the semiconductor device 3 of the second embodiment, it is not necessary that the respective sub-shields that manufacture the shield 1333 are also be electrically connected to the fixed electric potentials of both of the pixel chip 131 and the circuit chip 132 if the respective sub-shields are connected to the fixed electric potential within any one chip.

In this way, also in the solid state imaging device 13 of the third embodiment, the shield 1333 is manufactured around regions where the bumps 13321 for pixel signals are manufactured, similar to the semiconductor device 3 of the first embodiment and the second embodiment. Accordingly, also in the solid state imaging device 13 of the third embodiment, noise mixed in the pixel signals transmitted from the pixel chip 131 via the bumps 13321 for pixel signals to the circuit chip 132 can be reduced in the portion of the connection region 133 where a gap between the pixel chip 131 and the circuit chips 132 is in a hollow state. That is, in the solid state imaging device 13 of the third embodiment, noise mixed in the pixel signals immediately after the unit pixels 1313 have output their pixel signals can be shielded. Thus, in the solid state imaging device 13 of the third embodiment, an excellent image with little noise can be obtained.

Additionally, in the solid state imaging device 13 of the third embodiment, both of the bumps 13321 for pixel signals and the bump 13322 for a control signal electrically connect the pixel chip 131 and the circuit chip 132. The bumps 13321 for pixel signals and the bump 13322 for a control signal are respectively manufactured of the same material, such as gold (Au) plating, copper (Cu) plating, or nickel (Ni) plating. Additionally, the shield 1333 is manufactured of the same material as that of the bumps 13321 for pixel signals and the bump 13322 for a control signal. However, as can be seen from FIG. 11, the shield 1333 is manufactured so as to surround only the bumps 13321 for pixel signals. This is because an image of which the image quality deterioration is suppressed is obtained by reducing noise mixed in the pixel signals when the pixel signals that are analog signals output by the unit pixels 1313 are transmitted from the pixel chip 131 via the bumps 13321 for pixel signals to the circuit chip 132. For this reason, in the solid state imaging device 13, the shield is not manufactured for the bump 13322 for a control signal to which a digital control signal, which is considered to have little influence caused by noise, is transmitted. In this way, the shield can be manufactured in consideration of the presence/absence of the possibility that each signal transmitted and received via a bump is influenced by noise.

Fourth Embodiment

Next, another configuration of the solid state imaging device 13 will be described. In addition, the solid state imaging device 13 of the fourth embodiment also has the same configuration as that of the solid state imaging device 13 to which the structure of the semiconductor device 3 of the present embodiment illustrated in FIG. 8 is applied. Therefore, in the following description, the same reference signs will be given to the same constituent elements as those of the solid state imaging device 13 of the third embodiment, and the detailed description thereof will be omitted.

Figure 12:
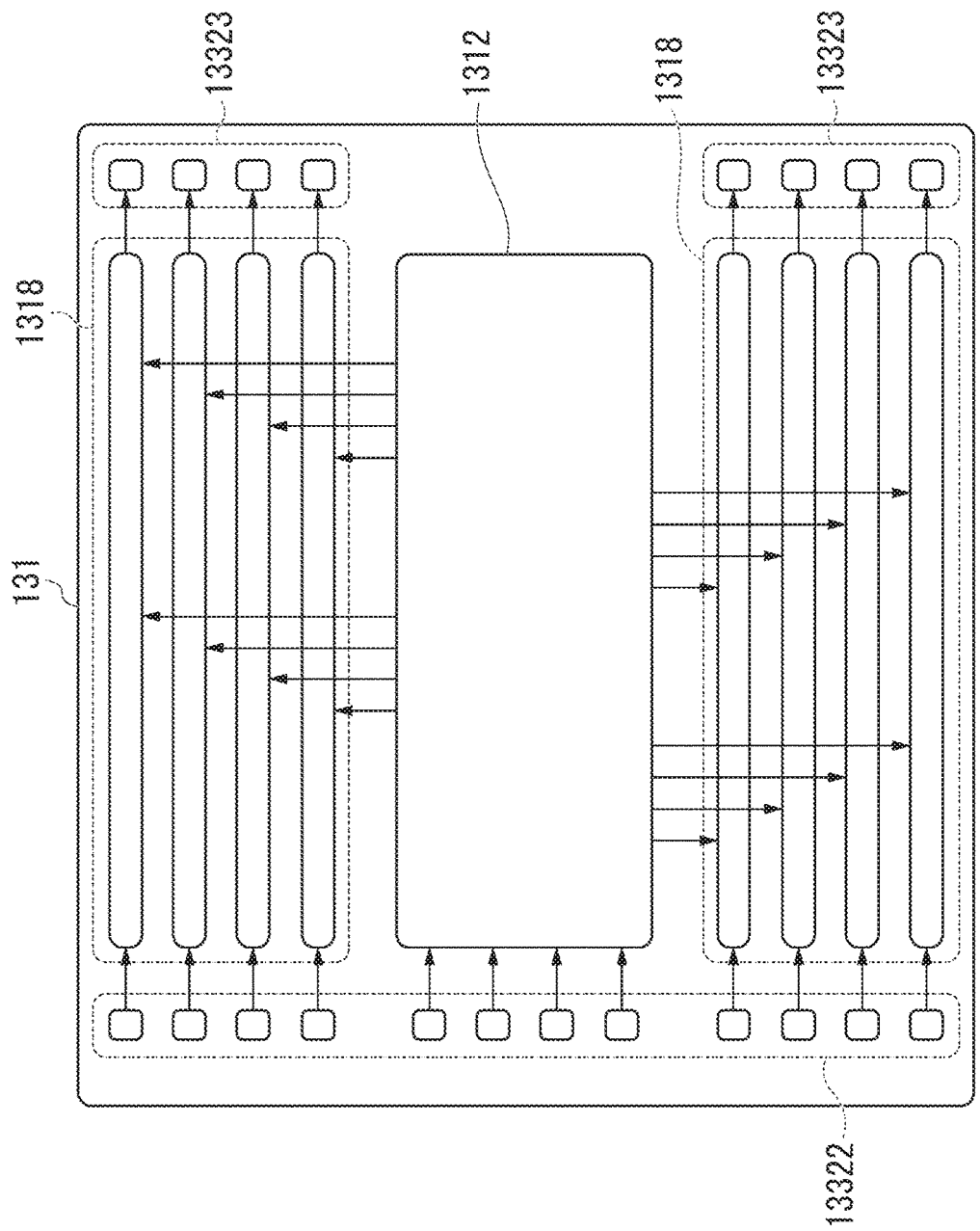
FIG. 12 is a circuit diagram illustrating the schematic configuration of a pixel chip in a solid state imaging device in a fourth embodiment of the invention.

First, the pixel chip 131 in the solid state imaging device 13 of the fourth embodiment will be described. FIG. 12 is a circuit diagram illustrating the schematic configuration of the pixel chip 131 within the solid state imaging device 13 in the fourth embodiment. In FIG. 12, the pixel chip 131 includes a first circuit constituted of the pixel array part 1312 and a pixel output digital processing circuits 1318, bumps 13322 for control signals, and bumps 13323 for pixel output digital processing circuits.

The respective unit pixels 1313 within the pixel array part 1312 output pixel signals to the pixel output digital processing circuits 1318 according to control signals input via the bumps 13322 for control signals from the circuit chip 132.

In this case, for example, row selection of the unit pixels 1313 included in the pixel array part 1312 is directly performed by the control signals input via the bumps 13322 for control signals.

The pixel output digital processing circuits 1318 perform digital signal processing on the pixel signals output from the respective unit pixels 1313 within the pixel array part 1312, and transmits the signals after the digital signal processing, which are transmitted to the circuit chip 132 via the bumps 13323 for pixel output digital processing circuits, according to the control signals input via the bumps 13322 for control signals from the circuit chip 132.

The pixel output digital processing circuits 1318 include, for example, an AD conversion circuit that converts the pixel signals, which are analog signals output by the unit pixels 1313, into digital data, and a digital signal processing circuit, such as a serializer, which serializes the multi-bit digital data after the AD conversion into 1-bit digital data, and outputs the 1-bit digital data sequentially. Additionally, the pixel output digital processing circuits 1318 include a clock signal supply circuit that supplies clock signals for driving the serializer.

In addition, sampling clock signals used when the pixel output digital processing circuits 1318 perform AD conversion, timing signals at which the serialized digital data is output, that is, clock signals supplied to the serializer by the clock signal supply circuit, are signals having higher speed than the control signals input via the bumps 13322 for control signals. Additionally, the sampling clock signals used for the AD conversion, and the timing signals at which the serialized digital data is output (the clock signals supplied to the serializer by the clock signal supply circuit) may become signals having still higher speed according to the resolving power of the AD conversion and the number of bits of digital data. For this reason, the signals after the digital signal processing transmitted to the circuit chip 132 via the bumps 13323 for pixel output digital processing circuits by the pixel output digital processing circuit 1318 become signals having higher speed than the control signals.

For example, a case where the pixel signals output by the unit pixels 1313 are AD-converted into 10-bit digital data and the 10-bit digital data after the AD conversion is output in the same cycle as a cycle in which a control signal controls the output of a pixel signal to one unit pixel 1313 is considered. That is, a case where the pixel output digital processing circuits 1318 output all the 10-bit digital data bit by bit in the cycle in which one unit pixel 1313 is controlled by the control signal is considered. In this case, the clock signals for allowing the serializer to output digital data (the clock signals supplied to the serializer by the clock signal supply circuit) have frequencies 10 times or more higher than the frequency of the control signal. That is, the cycle in which the serializer outputs the individual digital data is a cycle that is 10 times or more higher than the cycle in which the control signal controls the unit pixel 1313. For this reason, the signals of the 1-bit digital data serialized by the serializer also become signals that vary in an early cycle synchronized with the timing of the clock signals.

Figure 13:
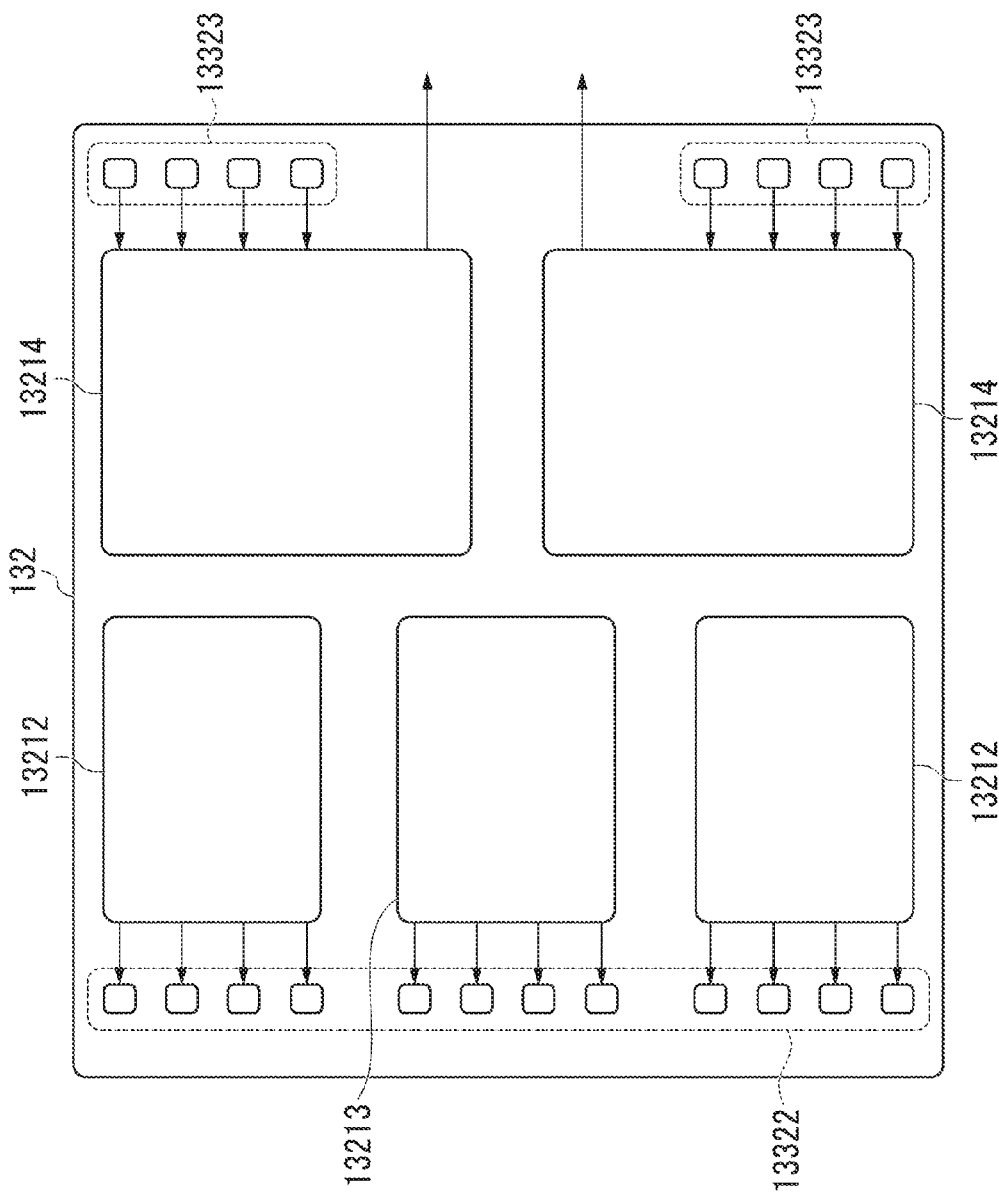
FIG. 13 is a circuit diagram illustrating the schematic configuration of the circuit chip in the solid state imaging device in the fourth embodiment.

Next, the circuit chip 132 in the solid state imaging device 13 of the fourth embodiment will be described. FIG. 13 is a circuit diagram illustrating the schematic configuration of the circuit chip 132 within the solid state imaging device 13 in the fourth embodiment. In FIG. 13, the circuit chip 132 includes a second circuit constituted of pixel output digital processing circuit control circuits 13212, a pixel array part control circuit 13213, pixel signal output circuits 13214, the bumps 13322 for control signals, and the bumps 13323 for pixel output digital processing circuits.

The pixel array part control circuit 13213 controls the respective unit pixels 1313 within the pixel array part 1312, thereby generating control signals for making the pixel signals of the respective unit pixels 1313 output to the corresponding pixel output digital processing circuits 1318. For example, the pixel array part control circuit 13213 generates control signals for selecting the respective unit pixels 1313 within the pixel array part 1312 in a row basis, control signals for resetting the respective unit pixels 1313, and the like. The respective control signals generated by the pixel array part control circuit 13213 are transmitted to the respective unit pixels 1313 within the pixel array part 1312 included in the pixel chip 131 via the bumps 13322 for control signals.

The pixel output digital processing circuit control circuits 13212 generate control signals for controlling the pixel output digital processing circuits 1318, thereby performing digital signal processing on the pixel signals output from the respective unit pixels 1313. For example, the pixel output digital processing circuit control circuits 13212 generate signal sample timing control signals for generating the sampling clock signals used when AD-converting the pixel signals, timing control signals for allowing the clock signal supply circuit to generate the clock signals used when the serializer serializes digital data, and the like. The control signals generated by the pixel output digital processing circuit control circuits 13212 are transmitted to the respective pixel output digital processing circuits 1318 included in the pixel chip 131 via the bumps 13322 for control signals.

The pixel signal output circuits 13214 receives the signals after the digital signal processing, which are transmitted via the bumps 13323 for pixel output digital processing circuits from the pixel output digital processing circuits 1318, and outputs the received signals (for example, digital data) after the digital signal processing to the outside as output signals of the solid state imaging device 13.

Figure 14:
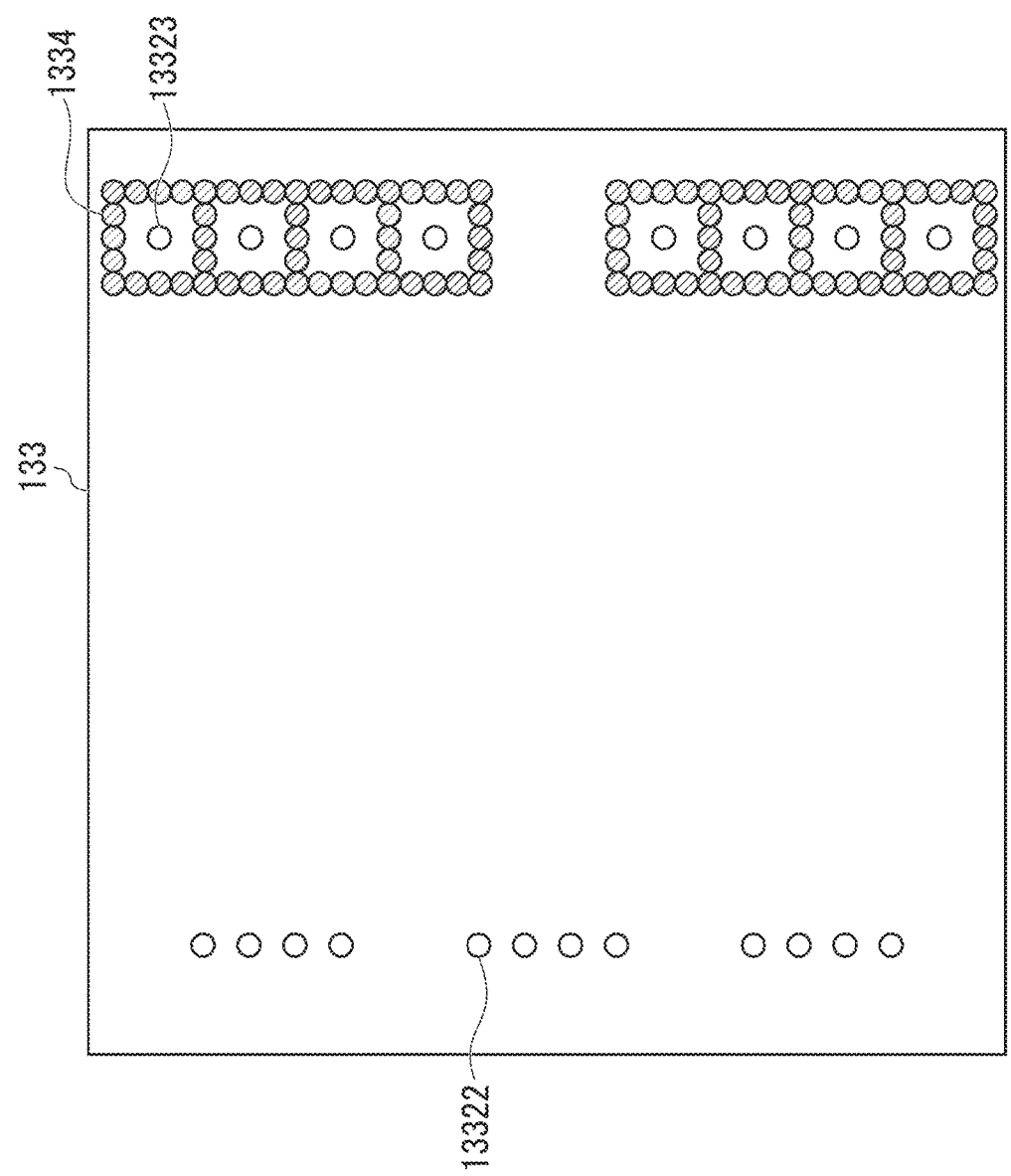
FIG. 14 is a sectional view illustrating the structure of the solid state imaging device in the fourth embodiment.

Next, the structure of the solid state imaging device 13 of the fourth embodiment will be described. FIG. 14 is a sectional view illustrating the structure of the solid state imaging device 13 in the fourth embodiment. FIG. 14 illustrates a sectional view of the solid state imaging device 13 in a portion (A-A section) illustrated by dotted line A-A in the overview diagram of the solid state imaging device 13 illustrated in FIG. 8, similar to the structure of the solid state imaging device 13 of the third embodiment illustrated in FIG. 11. As illustrated in FIG. 14, in the solid state imaging device 13, similar to the solid state imaging device 13 of the third embodiment illustrated in FIG. 11, a shield 1334 is manufactured so that a plurality of sub-shields with the same shape as the bumps 13322 for control signals or the bumps 13323 for pixel output digital processing circuits stretch in a line.

Fixed voltages are provided within the pixel chip 131 and the circuit chip 132. The shield 1334 is a noise shielding layer that is connected to the fixed electric potential of at least one of the pixel chip 131 and the circuit chip 132, similar to the shield 1333 in the solid state imaging device 13 of the third embodiment illustrated in FIG. 11. Additionally, as seen in the stacking direction of the pixel chip 131 and the circuit chip 132, the shield 1334 is manufactured so as to surround the respective bumps 13323 for pixel output digital processing circuits, and is connected to the fixed electric potential within the manufactured chip. The respective sub-shields that manufacture the shield 1334 are also manufactured of the same material as that of the bumps 13323 for pixel output digital processing circuits. In addition, similar to the respective sub-shields that manufacture the shield 1333 in the solid state imaging device 13 of the third embodiment, it is not necessary that the respective sub-shields that manufacture the shield 1334 are also be electrically connected to the fixed electric potentials of both of the pixel chip 131 and the circuit chip 132 if the respective sub-shields are connected to the fixed electric potential within any one chip.

In addition, the purpose of manufacturing the shield 1334 is different from that of the solid state imaging device 13 of the third embodiment. More specifically, the shield 1334 is not manufactured for the purpose of reducing noise mixed in the signals transmitted and received between the pixel chip 131 and the circuit chip 132 via the bumps 13323 for pixel output digital processing circuits, but is manufactured for the purpose of reducing noise that is released from the signals transmitted and received between the pixel chip 131 and the circuit chip 132. This is because, as described above, the signals after the digital signal processing, which are transmitted from the pixel chip 131 via the bumps 13323 for pixel output digital processing circuits to the circuit chip 132, are signals that vary in a cycle earlier than the control signals transmitted from the circuit chip 132 via the bumps 13322 for control signals to the pixel chip 131. That is, if noise is released due to the signals after the digital signal processing that vary in an early cycle, this noise may influence other signals within the solid state imaging device 13. Therefore, in the solid state imaging device 13 of the fourth embodiment, noise released by the signals after the digital signal processing is shielded by manufacturing the shield 1334. This reduces the mixing of noise into the signals.

In this way, also in the solid state imaging device 13 of the fourth embodiment, the shield 1334 is manufactured around regions where the bumps 13323 for pixel output digital processing circuits are manufactured, similar to the solid state imaging device 13 of the third embodiment. In this case, in the solid state imaging device 13 of the fourth embodiment, the shield is manufactured so as to surround the peripheries of the respective umps 13323 for pixel output digital processing circuits that transmit and receive the signals that may release noise, that is, the signals that operate at a high speed.

Accordingly, also in the solid state imaging device 13 of the fourth embodiment, noise released by the signals after the digital signal processing, which are transmitted from the pixel chip 131 via the bumps 13323 for pixel output digital processing circuits to the circuit chip 132, can be reduced in the portion of the connection region 133 where a gap between the pixel chip 131 and the circuit chips 132 is in a hollow state. That is, in the solid state imaging device 13 of the fourth embodiment, noise released by the signals after the digital signal processing immediately after the pixel output digital processing circuits 1318 have output the signals after the digital signal processing can be shielded. Thus, also in the solid state imaging device 13 of the fourth embodiment, an excellent image with little noise can be obtained.

Additionally, in the solid state imaging device 13 of the fourth embodiment, both of the bumps 13322 for control signals and the bumps 13323 for pixel output digital processing circuits electrically connect the pixel chip 131 and the circuit chip 132. The bumps 13322 for control signals and the bumps 13323 for pixel output digital processing circuits are respectively manufactured of the same material, such as gold (Au) plating, copper (Cu) plating, or nickel (Ni) plating. Additionally, the shield 1334 is manufactured of the same material as that of the bumps 13322 for control signals and the bumps 13323 for pixel output digital processing circuits. However, as can be seen from FIG. 14, the shield 1334 is manufactured so as to surround only the bumps 13323 for pixel output digital processing circuits. This is because, as described above, an image of which the image quality deterioration is suppressed is obtained by reducing noise released when the digital signals according to the pixel signals output by the unit pixels 1313 are transmitted from the pixel chip 131 via the bumps 13323 for pixel output digital processing circuits to the circuit chip 132. For this reason, in the solid state imaging device 13 of the fourth embodiment, the shield is not manufactured for the bumps 13322 for control signals which operates at a relatively low speed and to which control signals, which is considered to have little possibility of releasing noise, are transmitted. In this way, the shield can be manufactured in consideration of the presence/absence of the possibility of releasing noise for each signal by sorting the signals transmitted and received via the bump into signals that operate at a high speed and signals that operate at a low speed.

In addition, for example, when the pixel output digital processing circuit control circuits 13212 directly transmit the signal sample timing control signals for generating the sampling clock signals used when the pixel output digital processing circuits 1318 AD-converts the pixel signals and the clock signals used when the serializer serializes digital data, and the like via the corresponding bumps 13322 for control signals, it is considered that a shield is manufactured so as to surround the peripheries of the bumps 13322 for control signals. However, even in a case where the pixel output digital processing circuit control circuits 13212 directly transmit the clock signals, for example, when multiplication circuits are provided within the pixel output digital processing circuits 1318 and the transmitted clock signals are multiplied and used within the pixel chip 131, it is also considered that shields adjacent the corresponding bumps 13322 for control signals are not manufactured.

As described above, according to the embodiments for carrying out the invention, within the connection region where the chip connection parts manufactured in the respective semiconductor chips are electrically connected, the shield is adjacent to the respective chip connection parts and is manufactured at the position where the chip connection parts are sandwiched (the chip connection parts are surrounded). Accordingly, in the semiconductor devices of the embodiments for carrying out the invention, even if a gap between the respective semiconductor chips is in a hollow state, noise mixed in the signals connected via the chip connection parts or noise released from the signals connected via the chip connection parts can be reduced, that is, noise can be shielded. Thus, in the embodiments for carrying out the invention, semiconductor devices of a three-dimensional structure with little influence caused by noise can be provided.

Additionally, according to the embodiments for carrying out the invention, the shield is manufactured in consideration of the presence/absence of the influence of noise, such as analog signals or signals that operate at a high speed, or the presence/absence of the release of noise. Additionally, in the embodiments for carrying out the invention, the shield can be easily manufactured by the same method as the manufacturing process for manufacturing the respective chip connection parts. Accordingly, in the semiconductor devices of the embodiments for carrying out the invention, the shield can be more effectively manufactured.

In addition, in the present embodiments, a case where the structure of the semiconductor device of the invention is applied to the solid state imaging device has been described. However, the semiconductor device to which the structure of the semiconductor device of the invention can be applied is not limited to the embodiments for carrying out the invention. Additionally, the specific configuration or structure in the invention is not limited to the embodiments for carrying out the invention, and various changes can be made without departing from the spirit of the invention. For example, even in a case where the positions where the chip connection parts are manufactured or the constituent elements or circuit configuration of the semiconductor device is changed by circuit elements within the semiconductor device being changed, if a semiconductor device of a three-dimensional structure that transmits and receives signals via the chip connection parts manufactured in the semiconductor chips is provided, the concept of the invention can also be applied to semiconductor devices of any configuration.

Additionally, in the fourth embodiment, an example in which, the digital signal processing circuits, such as the AD conversion circuit and the serializer, and the clock signal supply circuit and the multiplication circuit are included within the pixel output digital processing circuits 1318 has been described. However, the concept of the invention can be applied even when the constituent elements or the circuit configuration differ. For example, even in a configuration in which all or some of the AD conversion circuit, the serializer, clock signal supply circuit, and the multiplication circuit are included within the circuit chip 132, the concept of the invention can be applied.

Additionally, in the semiconductor device and the solid state imaging device related to the embodiment of the invention, two substrates may be connected by the connection parts, or three or more substrates may be connected by the connection parts. In the case of a semiconductor device and a solid state imaging device in which three or more substrates are connected by the connection parts, two of them are equivalent to the first substrate and the second substrate related to the claims.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor device comprising:
   a first substrate having a first circuit manufactured thereon;
   a second substrate having a second circuit manufactured thereon and being arranged to be spaced to the first substrate;
   a connection part that is arranged between the first substrate and the second substrate and electrically connects the first circuit and the second circuit; and
   a shielding layer that is sandwiched, together with the connection part, between the first substrate and the second substrate, is arranged so as to surround the connection part, and is connected to an electric potential with a constant value within at least one of the first substrate and the second substrate,
   wherein, when the signals transmitted and received via the connection part between the first circuit manufactured on the first substrate and the second circuit manufactured on the second substrate are sorted into signals that operate at a low speed and signals that operate at a high speed, the shielding layer is arranged so as to surround the connection part that transmit and receive the signals that operate at the high speed and the shielding layer is not arranged so as to surround the connection part that transmit and receive the signals that operate at the low speed.

2. The semiconductor device according to claim 1,
   wherein the shielding layer includes a plurality of unit shielding layers, and
   wherein, as seen from a direction in which the first substrate and the second substrate are stacked, the plurality of unit shielding layers are arranged so as to surround the connection part.

3. The semiconductor device according to claim 2,
   wherein the shielding layer includes a first unit shielding layer and a second unit shielding layer, and
   wherein the first unit shielding layer and the second unit shielding layer are arranged so as to surround the corresponding connection part.

4. The semiconductor device according to claim 3,
   wherein the shielding layer further includes a third unit shielding layer and a fourth unit shielding layer, and
   wherein the third unit shielding layer and the fourth unit shielding layer are arranged so as to surround the corresponding connection part, in a direction orthogonal to a line connecting positions where the corresponding first unit shielding layer and second unit shielding layer are arranged.

5. The semiconductor device according to claim 2,
   wherein the plurality of unit shielding layers have the same shape as connecting surfaces for the connection part, the connecting surfaces being respectively manufactured on the first substrate and the second substrate.

6. The semiconductor device according to claim 1,
   wherein an electric potential is manufactured on either the first substrate or the second substrate, and the shielding layer is connected to the electric potential with a constant value within the substrate on which the shielding layer is manufactured.

7. The semiconductor device according to claim 2,
   wherein one unit shielding layer of the first unit shielding layer and the second unit shielding layer is manufactured on the first substrate and the other unit shielding layer is manufactured on the second substrate, and
   wherein the first unit shielding layer and the second unit shielding layer are respectively connected to electric potentials with constant values within the substrates on which the unit shielding layers are manufactured.

8. The semiconductor device according to claim 1,
   wherein the first circuit includes a plurality of pixels that convert incident light into electrical signals and transmit the converted electrical signals to the second circuit via the connection part as pixel signals, and
   wherein the second circuit includes a processing circuit that receives the pixel signals transmitted from the respective pixels via the connection part and performs processing on the received pixel signals.

9. The semiconductor device according to claim 8,
   wherein the shielding layer is arranged so as to surround the connection part that transmit and receive analog signals between the first circuit manufactured on the first substrate and the second circuit manufactured on the second substrate.

10. The semiconductor device according to claim 1, wherein the signals that operate at the low speed are control signals.

11. The semiconductor device according to claim 8, wherein the first circuit or the second circuit further include an AD conversion circuit that converts the pixel signals into digital data;

a serializer that serializes the multi-bit digital data after the AD conversion into 1-bit digital data; and a clock signal supply circuit that supplies clock signals that drive the serializer.

12. The semiconductor device according to claim 1, wherein the shielding layer is manufactured of the same material as the connection part.

* * * * *